(12) United States Patent
Miya et al.

(10) Patent No.: US 8,039,404 B2
(45) Date of Patent: Oct. 18, 2011

(54) PRODUCTION METHOD FOR SEMICONDUCTOR DEVICE

(75) Inventors: Hironobu Miya, Toyama (JP); Kazuyuki Toyoda, Toyama (JP); Norikazu Mizuno, Toyama (JP); Taketoshi Sato, Toyama (JP); Masanori Sakai, Toyama (JP); Masayuki Asai, Toyama (JP); Kazuyuki Okuda, Toyama (JP); Hideki Horita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/788,697

(22) Filed: May 27, 2010

(65) Prior Publication Data

US 2010/0233887 A1    Sep. 16, 2010

Related U.S. Application Data

(62) Division of application No. 11/666,360, filed as application No. PCT/JP2006/002659 on Feb. 15, 2006, now Pat. No. 7,779,785.

(30) Foreign Application Priority Data

Feb. 17, 2005 (JP) ................................ 2005-040501

(51) Int. Cl.
*H01L 21/469* (2006.01)
(52) U.S. Cl. ..... 438/786; 438/778; 438/779; 438/E21.24
(58) Field of Classification Search ........... 438/765–784
See application file for complete search history.

(56) References Cited

U.S. PATENT DOCUMENTS

| | | | |
|---|---|---|---|
| 6,660,660 B2 * | 12/2003 | Haukka et al. ................ | 438/778 |
| 2004/0053472 A1 | 3/2004 | Kiryu et al. | |
| 2008/0166882 A1 | 7/2008 | Miya et al. | |

FOREIGN PATENT DOCUMENTS

| | | |
|---|---|---|
| EP | 1 326 271 A1 | 9/2003 |
| JP | 06-326030 A | 11/1994 |
| JP | 2000-195820 A | 7/2000 |
| JP | 2002-050622 A | 2/2002 |
| JP | 2003-115548 A | 4/2003 |
| JP | 2004-047948 A | 2/2004 |
| JP | 2004-095900 A | 3/2004 |
| JP | 2004-281583 A | 10/2004 |
| JP | 2004-281853 A1 | 10/2004 |
| KR | 2003-0051654 A | 6/2003 |
| WO | WO 02/23614 A1 | 3/2002 |

OTHER PUBLICATIONS

Chinese Office Action dated Aug. 12, 2010 and its English translation.

* cited by examiner

*Primary Examiner* — Dung A. Le
(74) *Attorney, Agent, or Firm* — Birch, Stewart, Kolasch & Birch, LLP.

(57) ABSTRACT

A production method for a semiconductor device comprising the first step of supplying a first reaction material to a substrate housed in a processing chamber to subject to a ligand substitution reaction a ligand as a reaction site existing on the surface of the substrate and the ligand of the first reaction material, the second step of removing the excessive first reaction material from the processing chamber, the third step of supplying a second reaction material to the substrate to subject a ligand substituted by the first step to a ligand substitution reaction with respect to a reaction site, the fourth step of removing the excessive second reaction material from the processing chamber, and a fifth step of supplying a third reaction material excited by plasma to the substrate to subject a ligand, not subjected to a substitution reaction with respect to a reaction site in the third step, to a ligand substitution reaction with respect to a reaction site, wherein the steps 1-5 are repeated a specified number of times until a film of a desired thickness is formed on the substrate surface.

3 Claims, 19 Drawing Sheets

FIG.14
| H₂ plasma processing | Concentration of Cl in film (atoms/cc) | Film stress (Gpa) |
|---|---|---|
| Every one cycle | 6.2E+19 | 1.95 |
| Every five cycles | 8.0E+19 | 1.65 |
| Every ten cycles | 8.5E+19 | 1.575 |
| No H₂ plasma processing (Conventional sequence) | 1.0E+20 | 1.5 |
FIG.15
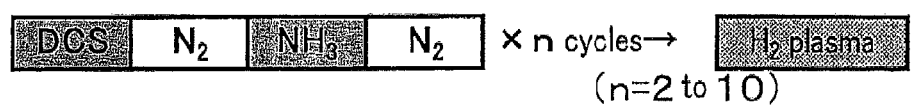
FIG.16
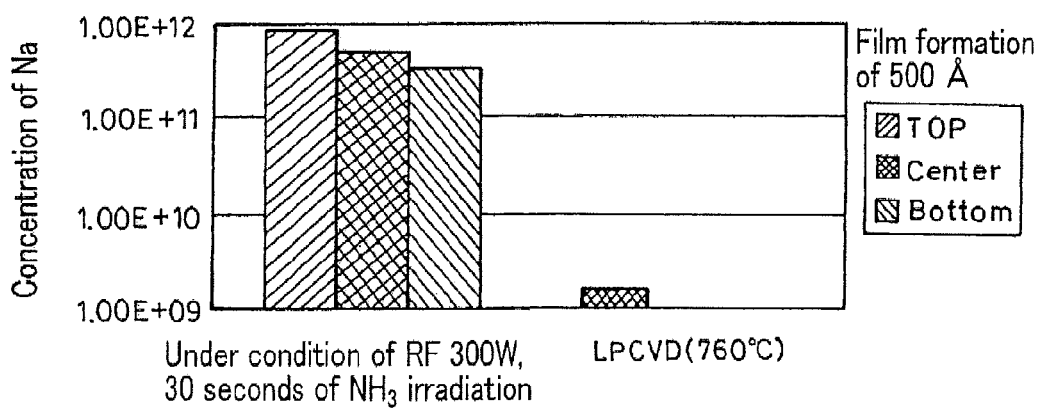

Case of NH₃ plasma irradiation

Case of N₂ plasma irradiation

FIG.28

Transition of number of foreign matters of 0.1 to 0.13 μm
when pressure at the time of plasma irradiation is about 0.3 to 0.4 Torr.

| NO | Processing in second step | Before processing (A) | After processing (B) | Reducing width [(A)−(B)]/(A) × 100 |
|---|---|---|---|---|
| 1 | NH$_3$ plasma processing<br>N$_2$:NH$_3$ supply ratio = 0:1 | 694 | 337 | 51% |
| 2 | N$_2$+NH$_3$ mixture plasma processing<br>N$_2$:NH$_3$ supply ratio = 1:1 | 601 | 26 | 96% |
| 3 | N$_2$+NH$_3$ mixture plasma processing<br>N$_2$:NH$_3$ supply ratio = 6:1 | 605 | 10 | 98% |
| 4 | N$_2$ plasma processing<br>N$_2$:NH$_3$ supply ratio = 1:0 | 597 | 567 | 5% |
| 5 | N$_2$ purge processing<br>N$_2$:NH$_3$ supply ratio = 1:0 | 544 | 497 | 8.6% |

FIG.29

Transition of number of foreign matters of 0.1 to 0.13 μm
when pressure at the time of plasma irradiation is 0.5 Torr or higher.

| NO | Processing in second step | Before processing | After processing | Reducing width |
|---|---|---|---|---|
| 1 | N$_2$+NH$_3$ mixture plasma processing<br>N$_2$:NH$_3$ supply ratio = 1:1 | 408 | 409 | 0% |

PRODUCTION METHOD FOR SEMICONDUCTOR DEVICE

This application is a Divisional of co-pending application Ser. No. 11/666,360 filed on Apr. 26, 2007 which is a National Stage of International Application No. PCT/JP06/302659 filed on Feb. 15, 2006, the entire contents of which are hereby incorporated by reference and for which priority is claimed under 35 U.S.C. §120.

FIELD OF THE INVENTION

The present invention relates to a producing method of a semiconductor device and a substrate processing apparatus.

DESCRIPTION OF THE RELATED ART

To produce a semiconductor device, a thin film such as a dielectric film, a metal oxide film or the like is formed on a semiconductor substrate at a low temperature by a CVD (Chemical Vapor Deposition) method or an ALD (Atomic Layer Deposition) method.

However, in the thin film formed at a lower temperature (600° C. or lower), problems such as increase in etching speed (when film quality is checked, the produced film is etched and evaluated, and if the film is not dense, the etching speed is increased), and film shrinkage when high temperature process is carried out are generated. Therefore, a method and an apparatus for producing a high quality film are desired.

SUMMARY OF THE INVENTION

Hence, it is a main object of the present invention to provide a producing method of a semiconductor device and a substrate processing apparatus capable of forming a high quality thin film even when the thin film is formed at a low temperature.

According to one aspect of the present invention, there is provided a producing method of a semiconductor device comprising: a first step of supplying a first reactant to a substrate accommodated in a processing chamber to cause a ligand-exchange reaction between a ligand of the first reactant and a ligand as a reactive site existing on a surface of the substrate; a second step of removing a surplus of the first reactant from the processing chamber; a third step of supplying a second reactant to the substrate to cause a ligand-exchange reaction to change the ligand after the exchange in the first step into a reactive site; a fourth step of removing a surplus of the second reactant from the processing chamber; and a fifth step of supplying a plasma-excited third reactant to the substrate to cause a ligand-exchange reaction to exchange a ligand which has not been exchange-reacted into the reactive site in the third step into the reactive site, wherein the first to fifth steps are repeated predetermined times until a film having a predetermined thickness is formed on the surface of the substrate.

According to another aspect of the present invention, there is provided a producing method of a semiconductor device comprising: a thin film forming comprising: supplying a first reactant into a processing chamber in which a substrate is accommodated to cause the first reactant to be absorbed on a surface of the substrate; removing a surplus of the first reactant from the processing chamber; supplying a second reactant into the processing chamber to cause the second reactant to react with the first reactant adsorbed on the surface of the substrate to form a thin film of at least one atomic layer; and removing a surplus of the second reactant from the processing chamber; and a plasma processing of supplying a plasma-excited gas into the processing chamber to improve a film quality of the thin film after the thin film forming, wherein the thin film forming and the plasma processing are repeated predetermined times until a thin film having a predetermined thickness is formed.

According to still another aspect of the present invention, there is provided a producing method of a semiconductor device comprising: a thin film forming step of repeating the following four steps to form a thin film of several atomic layers on a substrate, supplying a first reactant into a processing chamber in which a substrate is accommodated to cause the first reactant to be absorbed on a surface of the substrate; removing a surplus of the first reactant from the processing chamber, supplying a second reactant into the processing chamber to cause the second reactant to react with the first reactant adsorbed on the surface of the substrate to form a thin film of at least one atomic layer, and removing a surplus of the second reactant from the processing chamber; and a plasma processing step of supplying an oxygen atom-containing gas into the processing chamber to improve a film quality of the thin film after the thin film forming step, wherein the thin film forming step and the plasma processing step are repeated predetermined times until a thin film having a predetermined thickness is formed.

According to still another aspect of the present invention, there is provided a producing method of a semiconductor device comprising: a oxide film forming step of repeating the following four steps to form an oxide film having a desired thickness on a silicon film, supplying a first reactant into a processing chamber in which a substrate, the silicon film is exposed from a surface of which, is accommodated to cause the first reactant to be adsorbed onto a surface of the silicon film, removing a surplus of the first reactant from the processing chamber, supplying a second reactant into the processing chamber to cause the second reactant to react with the first reactant adsorbed on the surface of the silicon film to form a thin film of at least one atomic layer, and removing a surplus of the second reactant from the processing chamber; and a plasma nitriding processing step of nitriding a surface of the oxide film using a gas including a nitrogen atom after the oxide film forming step.

According to still another aspect of the present invention, there is provided a substrate processing apparatus, comprising: a processing chamber in which a substrate is to be accommodated; a first supply means for supplying a first reactant into the processing chamber; a second supply means for supplying a second reactant into the processing chamber; a third supply means for supplying a third reactant into the processing chamber; an exhausting means for evacuating the processing chamber; an exciting means for plasma-exciting the third reactant; and a control means for controlling the first to third supply means, the exhaust means and the exciting means, wherein the control means controls the first to third supply means, the exhausting means and the exciting means, to repeat the following first to fifth steps predetermined times until a thin film having a desired thickness is formed; the first step of supplying the first reactant to the substrate accommodated in the processing chamber to cause a ligand-exchange reaction between a ligand as a reactive site existing on a surface of the substrate and a ligand of the first reactant; the second step of removing a surplus of the first reactant from the processing chamber; the third step of supplying a second reactant to the substrate to cause a ligand-exchange reaction to change the ligand after the exchange in the first step into a reactive site; the fourth step of removing a surplus of the second reactant from the processing chamber; and the fifth step of supplying a plasma-excited third reactant to the substrate to cause a ligand exchange reaction to exchange a ligand which has not been exchange-reacted into the reactive site in the third step into the reactive site.

According to still another aspect of the present invention, there is provided a substrate processing apparatus, comprising: a processing chamber in which a substrate is to be accommodated; a first supply means for supplying a first reactant into the processing chamber; a second supply means for supplying a second reactant into the processing chamber; a third supply means for supplying a third reactant into the processing chamber; an exhausting means for evacuating the processing chamber; an exciting means for plasma-exciting the third reactant; and a control means for controlling the first to third supply means, the exhaust means and the exciting means, wherein the control means controls the first to third supply means, the exhausting means and the exciting means, to repeat a thin film forming step and a plasma processing step predetermined times until a thin film having a desired thickness is formed, the thin film forming step comprising: a step of supplying the first reactant into the processing chamber in which the substrate is accommodated to cause the first reactant to be absorbed on a surface of the substrate; a step of removing a surplus of the first reactant from the processing chamber; a step of supplying the second reactant into the processing chamber to cause the second reactant to react with the first reactant adsorbed on the surface of the substrate to form a thin film of at least one atomic layer; and a step of removing a surplus of the second reactant from the processing chamber, and the plasma processing step supplying the plasma-excited third reactant into the processing chamber for improving a film quality of the thin film after the thin film forming step.

According to still another aspect of the present invention, there is provided a substrate processing apparatus, comprising: a processing chamber in which a substrate is to be accommodated; a first supply means for supplying a first reactant into the processing chamber; a second supply means for supplying the first reactant into the processing chamber; an exhausting means for exhausting an atmosphere in the processing chamber; a third supply means for supplying an oxygen atom-containing gas into the processing chamber; a plasma means for bringing the oxygen atom-containing gas into a plasma state; and a control means for controlling the first to third supply means, the exhausting means and the plasma means, wherein the control means controls the first to third supply means, the exhausting means and the plasma means, to repeat a thin film forming step and a plasma processing step predetermined times until a thin film having a desired thickness is formed, the thin film forming step comprising: a step of supplying the first reactant into the processing chamber to cause the first reactant to be absorbed on a surface of the substrate; a step of removing a surplus of the first reactant from the processing chamber; a step of supplying the second reactant into the processing chamber to cause the second reactant to react with the first reactant adsorbed on the surface of the substrate to form a thin film of one atomic layer; and a step of removing a surplus of the second reactant from the processing chamber, and the plasma processing step supplying an oxygen atom-containing gas into the processing chamber for improving a film quality of the thin film after the thin film forming step.

BRIEF DESCRIPTION OF DRAWINGS

FIG. 14 is a diagram showing a concentration of Cl and a film stress in a film in the ALD film forming using $H_2$ plasma in the fourth embodiment.

FIG. 15 is a diagram for explaining a sequence of the ALD film forming method using $H_2$ plasma in the fourth embodiment.

FIG. 16 is a diagram showing concentrations of Na in films formed by the ALD method and an LPCVD method.

FIG. 28 is a diagram showing a number of foreign matters when a pressure at the time of plasma irradiation in the second step in the sixth embodiment is about 0.3 to 0.4 Torr.

FIG. 29 is a diagram showing a number of foreign matters when a pressure at the time of plasma irradiation in the second step in the sixth embodiment is about 0.5 Torr or higher.

DESCRIPTION OF THE PREFERRED EMBODIMENTS

Figure 1:
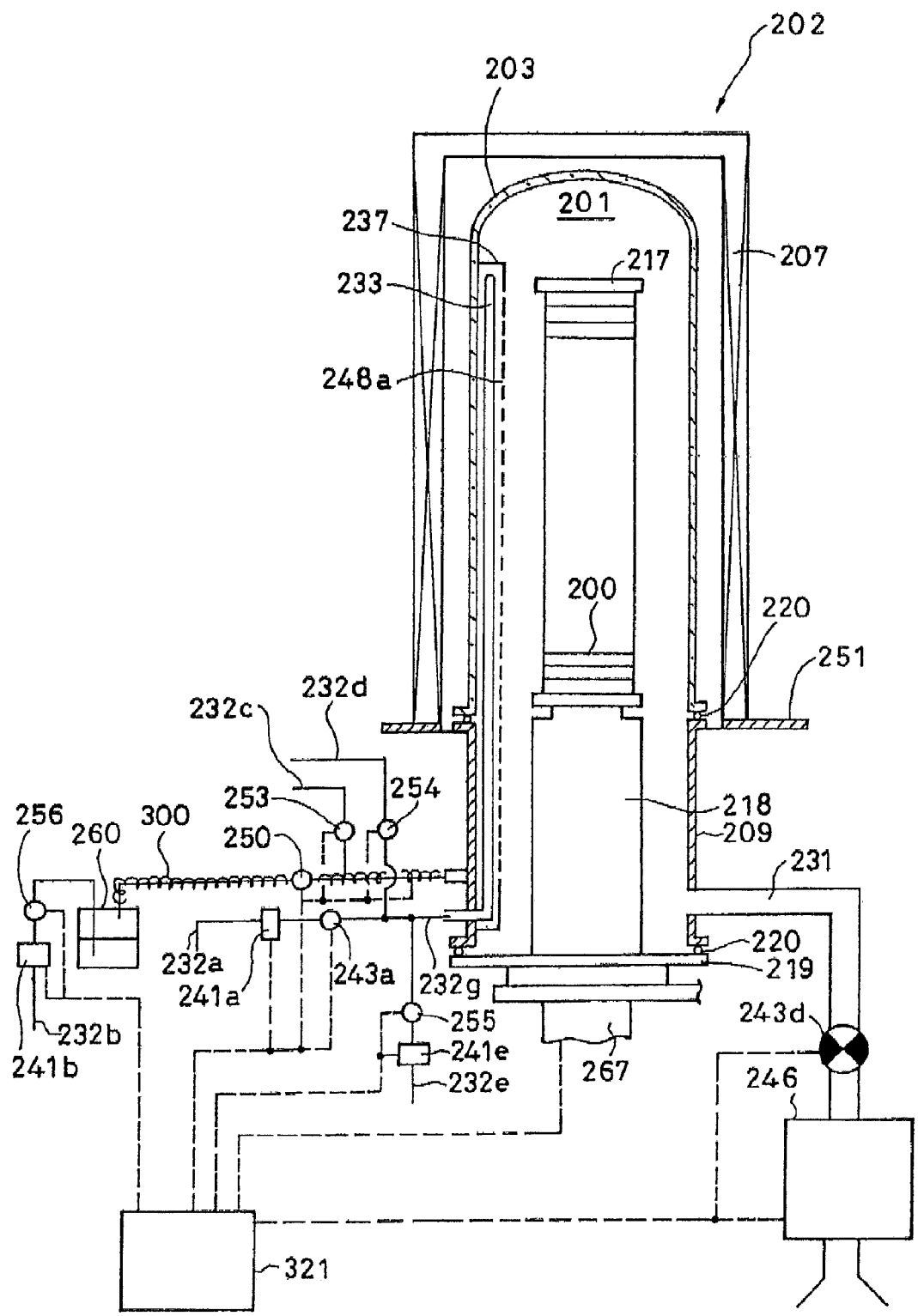
FIG. 1 is a schematic vertical sectional view for explaining a vertical type substrate processing furnace in a substrate processing apparatus of a first embodiment of the present invention.

Next, preferred embodiments of the present invention will be explained.

In the preferred embodiments of the present invention, a film forming operation and plasma processing are continuously carried out in the same processing chamber to form a high quality film at a low temperature.

By doing like this, an ALD process can also be used easily. In the ALD method, a step of supplying a first reactant into a processing chamber accommodating a substrate therein and for allowing the first reactant to be absorbed on a surface of the substrate, a step of removing a surplus of the first reactant from the processing chamber, a step of supplying a second reactant into the processing chamber and for allowing the second reactant to react with the first reactant adsorbed on the surface of the substrate to form a thin film of at least one atomic layer, and a step of removing a surplus of the second reactant from the processing chamber are repeated a plurality of times, thereby depositing the thin film on the substrate. In the preferred embodiments of the present invention, the first reactant and the second reactant react with each other on a surface on which a film is to be formed, to form a thin film by one atomic layer by one atomic layer, and plasma processing is carried out every one atomic layer to improve the film quality, or the plasma processing is carried out after several atomic layers are formed to improve the film quality. Since the film quality can be improved by plasma at a low temperature, a problem that a diffusion layer spreads at the time of high temperature processing is not generated.

In the preferred embodiments of the present invention, plasma of oxygen or oxygen nitride such as $O_2$, $N_2O$, NO, $NO_2$, $H_2O$ is used for the plasma processing. Alternatively, plasma of nitride or nitride hydride such as $N_2$ and $NH_3$, or plasma of Ar or $H_2$ is used.

In the preferred embodiments of the present invention, not only embodiments in which the plasma processing is carried out whenever a thin film of one layer or several layers is formed by the ALD method, but also embodiments in which the plasma processing is carried out after a thin film having a predetermined thickness is formed by the ALD method or before a predetermined thin film is formed by the ALD method are included.

In the ALD method, when a case in which TMA ($Al(CH_3)_3$, trimethylaluminum) and $O_3$ (ozone) are alternately supplied to form an $Al_2O_3$ (aluminum oxide) film is considered, if a TMA molecule is adsorbed on a foundation, with methyl groups ($CH_3$ groups) being coupled to two coupling hands of an Al atom of the TMA molecule, a methyl group which is coupled to the remaining one of the coupling hands is eliminated by a ligand-exchange reaction with an OH group which is a ligand functioning as a reactive site on a substrate surface, resulting in coupling to the foundation. If $O_3$ is supplied in this state, the two methyl groups, which are ligands, are eliminated as $H_2O$ and $CO_2$ by a ligand-exchange reaction (more specifically, a ligand removing reaction) with $O_3$ which functions as a ligand removing agent, and OH groups which function as reactive sites are coupled to the two coupling hands of the Al atom of the TMA molecule. Thereafter, if TMA molecules are supplied, H atoms of the two OH groups (ligand as reactive site) and methyl groups (ligand) of the TMA molecule are coupled to each other by a ligand-exchange reaction to eliminate them as methane molecules, and coupling hands of the Al atoms after methyl molecules are eliminated are coupled to two O groups from which H atoms are eliminated. The film forming process thus proceeds and $Al_2O_3$ is formed in this manner. However, if incomplete oxidation reaction (ligand removing reaction) occurs for some reason, even $O_3$ is supplied for example, only one of the two methyl groups reacts with $O_3$ and is eliminated as $H_2O$ and $CO_2$, and an OH group is coupled to one coupling hand of the Al atom of the TMA molecule (ligand-exchange reaction), but the remaining one methyl group stays as it is in some cases. If TMA is supplied in such a state, the methyl group which has not been subjected to the ligand-exchange reaction into OH group is covered with TMA which is a raw material having high molecular-weight, and $O_3$ of next step does not reach the methyl group. If ALD production is continued in this state, the methyl group remains in the film and depletion is generated in such a portion in some cases.

However, if the substrate is irradiated with $O_2$ plasma having higher oxidizing performance than $O_3$, $O_2$ plasma can enter and reach the methyl group. As a result, the methyl group is eliminated from the film and is replaced by OH group, and although slight (about one layer) deposition delay (surface roughness) is generated as compared with a peripheral location where reaction normally occurred, the reaction proceeds from the OH group from the next processing step, and excellent film quality can be obtained. The above-described phenomenon appears after the alternate supply of TMA and $O_3$ is repeated at least two times (two cycles) and at least the second layer is formed. It is conceivable that if the plasma processing is carried out whenever one layer is formed (whenever one cycle of gas supply is carried out), most of residual methyl groups are replaced by OH groups by $O_2$ plasma, which allows the deposition to proceed while repairing incomplete oxidization reaction whenever one layer is formed, resulting in that C ingredient does not remain in the film almost at all.

On the other hand, when a film is formed by a CVD method, since AlxOy produced by a reaction between TMA and $O_3$ in a vapor phase falls onto a substrate and is deposited thereon, even if impurities of intermediate products containing C (ex. CO, $CO_2$, $CH_3$ and products having high molecular weight) are taken into the film in addition to $Al_2O_3$, the deposition of the film on the substrate proceeds. As a result, impurities are mixed in ten times order as compared with the ALD. Therefore, even if the plasma processing is carried out after a thin film of about 1 to 10 μm is produced, the impurities are pulled out from the film, and since the amount of the impurities is high, many depletion portions exist in the film. Further, some impurities are not pulled out and C ingredients remain in the film. As a result, even if the plasma processing is carried out after a thin film of about 1 to 10 μm is formed by the CVD method, a film quality is still poor, and there is a limit to the improvement of the film quality.

From the above reason, it is conceivable that a film having much higher quality can be formed if a thin film formation by the ALD method and plasma processing are combined with each other as compared with a case in which the plasma processing is carried out after a thin film of about 1 to 10 μm is produced by the CVD method.

Next, embodiments of the present invention will be explained in detail with reference to the drawings.

First Embodiment

Figure 2:
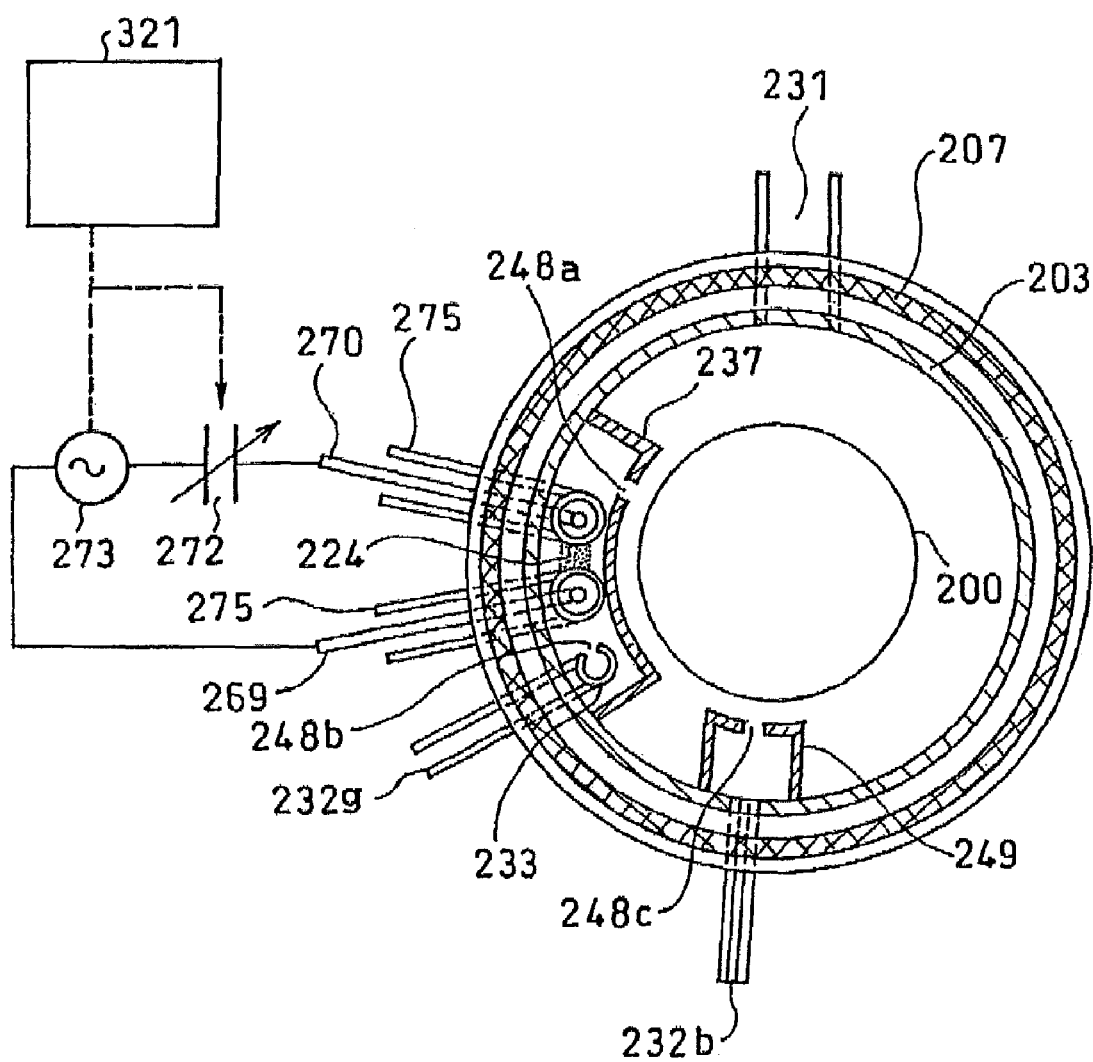
FIG. 2 is a schematic transverse sectional view for explaining the vertical type substrate processing furnace in the substrate processing apparatus of the first embodiment of the present invention.

FIG. 1 is a schematic vertical sectional view for explaining a vertical type substrate processing furnace of a substrate processing apparatus of the present embodiment. FIG. 2 is a schematic transverse sectional view for explaining the vertical type substrate processing furnace of the substrate processing apparatus of the present embodiment.

A reaction tube 203 as a reaction container to process wafers 200 as substrates is provided inside a heater 207 which is heating means. A manifold 209, made of a stainless steel and the like, is engaged with a lower end of the reaction tube 203. A lower end opening of the manifold 209 is air-tightly closed by a seal cap 219 which is a lid through an O-ring 220 which is a sealing member. At least the heater 207, the reaction tube 203, the manifold 209 and the seal cap 219 form a processing furnace 202. The reaction tube 203, the manifold 209, the seal cap 219, and a later-described buffer chamber 237 formed in the reaction tube 203 form a processing chamber 201. The manifold 209 is fixed to a holding means (heater base 251).

Annular flanges are provided on the lower end of the reaction tube 203 and an upper end opening of the manifold 209. A sealing member (O-ring 220, hereinafter) is disposed between these flanges, and the space between the flanges is air-tightly sealed.

A boat 217 which is substrate-holding means stands on the seal cap 219 through a quartz cap 218. The quartz cap 218 functions as a holding body which holds the boat 217. The boat 217 is inserted into the processing furnace 202. A plurality of wafers 200 to be batch processed are stacked on the boat 217 in many layers in an axial direction of the tube in their horizontal attitudes. The heater 207 heats the wafers 200 inserted into the processing furnace 202 to a predetermined temperature.

Three gas supply tubes 232a, 232b and 232e are provided as supply tubes through which gas is supplied to the processing chamber 201. The gas supply tubes 232b and 232e are merged into a gas supply tube 232g outside of the processing chamber 201. The gas supply tubes 232a and 232g pass through the lower part of the manifold 209. The gas supply tube 232g is in communication with one porous nozzle 233 in the processing chamber 201.

Reaction gas (TMA) is supplied to the processing chamber 201 through a mass flow controller 241a which is a flow rate control means, a valve 252 which is an open/close valve, a TMA container 260, and a valve 250 which is an open/close valve, and a later-described gas supply section 249. The gas supply tube 232b from the TMA container 260 to the manifold 209 is provided with a heater 300, and the temperature of the gas supply tube 232b is maintained at 50 to 60° C.

Reaction gas ($O_3$) is supplied from the gas supply tube 232a to the processing chamber 201 through a mass flow controller 241a which is a flow rate control means, a valve 243a which is an open/close valve, the gas supply tube 232g, the porous nozzle 233 and the later-described buffer chamber 237 formed in the reaction tube 203.

Oxygen plasma is supplied from the gas supply tube 232e to the processing chamber 201 through a mass flow controller 241e which is a flow rate control means, a valve 255 which is an open/close valve, the gas supply tube 232g, the porous nozzle 233 and the later-described buffer chamber 237 formed in the reaction tube 203.

A line 232c for inert gas is connected to the gas supply tube 232b on a downstream side of the valve 250 through an open/close valve 253. A line 232d for inert gas is connected to the gas supply tube 232a on a downstream side of a valve 243a through an open/close valve 254.

The nozzle 233 is provided along the stacking direction of the wafers 200 from a lower portion to a higher portion of the reaction tube 203. The nozzle 233 is provided with gas supply holes 248b through which a plurality of gases are supplied.

The buffer chamber 237 which is a gas dispersing space is provided in an arc space between the inner wall of the reaction tube 203 and the wafers 200. The buffer chamber 237 is provided along the stacking direction of the wafers 200 and along an inner wall of the reaction tube 203 from a lower portion to a higher portion of the reaction tube 203. Gas supply holes 248a which are supply holes through which gas is supplied are formed in an inner wall of the buffer chamber 237 near an end portion of the inner wall adjacent to the wafers 200. The gas supply holes 248a are opened toward the center of the reaction tube 203. The gas supply holes 248a have the same opening areas over a predetermined length from a lower portion to an upper portion along the stacking direction of the wafers 200, and pitches between the gas supply holes 248a are equal to each other.

A nozzle 233 is disposed near another end of the buffer chamber 237 on the opposite side from the end of the buffer chamber 237 where the gas supply holes 248a are provided. The nozzle 233 is disposed along the stacking direction of the wafers 200 from the lower portion to the higher portion of the reaction tube 203. The nozzle 233 is provided with a plurality of gas supply holes 248b which are supply holes through which gas is supplied.

The gas ejected from the gas supply hole 248b is ejected into the buffer chamber 237. The gas is once introduced into the buffer chamber 237, which makes it possible to equalize velocities of flows of gases.

That is, in the buffer chamber 237, the particle velocity of the gas ejected from each gas supply hole 248b is moderated in the buffer chamber 237 and then, the gas is ejected into the processing chamber 201 from the gas supply hole 248a. During that time, the gas ejected from each gas supply hole 248b becomes gas having equal flow rate and an equal velocity of flow when the gas is ejected from the gas supply hole 248a.

A rod-like electrode 269 and a rod-like electrode 270 having thin and long structures are disposed in the buffer chamber 237 such that these electrodes are protected by electrode protection tubes 275 which are protection tubes for protecting these electrodes from the higher portions to the lower portions. One of the rod-like electrode 269 and the rod-like electrode 270 is connected to the high frequency power supply 273 through the matching device 272, and the other electrode is connected to the ground which is a reference electric potential. As a result, plasma is produced in a plasma producing region 224 between the rod-like electrode 269 and the rod-like electrode 270.

These electrode protection tubes 275 have such structures that the rod-like electrode 269 and the rod-like electrode 270 can be inserted into the buffer chamber 237 in a state where the electrodes are isolated from the atmosphere of the buffer chamber 237. If the inside of the electrode protection tubes 275 is the same as the outside air (atmospheric air), the rod-like electrode 269 and the rod-like electrode 270 respectively inserted into the electrode protection tubes 275 are heated by the heater 207 and oxidized. Hence, there is provided an inert gas purge mechanism which charges or purges inert gas such as nitrogen into the electrode protection tubes 275, thereby sufficiently reducing the concentration of oxygen, to prevent the rod-like electrode 269 and the rod-like electrode 270 from being oxidized.

A gas supply section 249 is formed on an inner wall separated from the position of the gas supply holes 248a by about 120° along an inner periphery of the reaction tube 203. The gas supply section 249 is a supply section which shares the gas supply species with the buffer chamber 237 when the plurality kinds of gases are alternately supplied to the wafers 200 one kind by one kind when films are formed by the ALD method.

Like the buffer chamber 237, the gas supply section 249 also has gas supply holes 248c which are supply holes through which gas is supplied to positions adjacent to the wafers at the same pitch, and the gas supply section 249 is connected to a gas supply tube 232b at a lower portion thereof.

The processing chamber 201 is connected to a vacuum pump 246 which is exhausting means through a valve 243d by a gas exhaust tube 231 which is an exhaust tube through which gas is exhausted so that the processing chamber 201 is evacuated. The valve 243d is an open/close valve, and the processing chamber 201 can be evacuated and the evacuation can be stopped by opening and closing the valve 243d. If the opening of the valve is adjusted, the pressure in the processing chamber 201 can be adjusted.

The boat 217 is provided at a central portion in the reaction tube 203, and the plurality of wafers 200 are placed in many layers at equal distances from one another in the vertical direction. The boat 217 can be brought into and out from the reaction tube 203 by a boat elevator mechanism (not shown). To enhance the uniformity of the processing, a boat rotating mechanism 267 which is a rotating means for rotating the boat 217 is provided. By rotating the boat rotating mechanism 267, the boat 217 held by the quartz cap 218 is rotated.

A controller 321 which is a control means is connected to the mass flow controllers 241a, 241b and 241e, the valves 243a, 243d, 250, 252, 253, 254, and 255, the heater 207, the vacuum pump 246, the boat rotating mechanism 267, and a boat elevator mechanism (not shown). The controller 321 controls adjustment operations of flow rates of the mass flow controllers 241a, 241b, and 241e, opening and closing operations of the valves 243a, 250, 252, 253, 254 and 255, opening and closing operations of the valve 243d and adjustment operations of the pressure of the valve 243d, adjustment operation of the temperature of the heater 207, actuation and stop of the vacuum pump 246, adjustment operation of the rotation speed of the boat rotating mechanism 267, and the vertical motion of the boat elevator mechanism.

Figure 3:
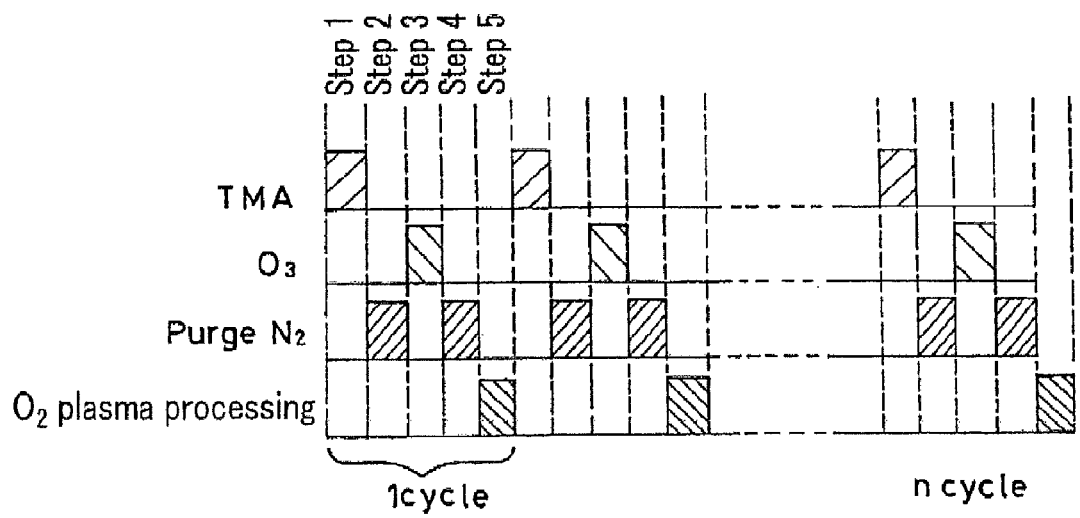
FIG. 3 is a diagram for explaining an ALD sequence of the first embodiment of the present invention.
Figure 4:
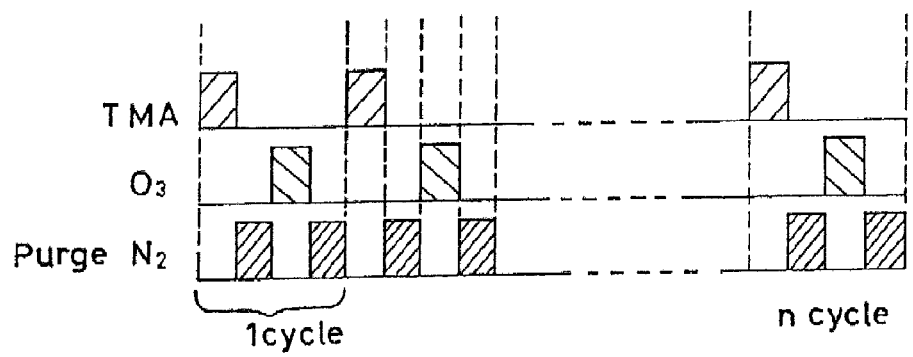
FIG. 4 is a diagram for explaining the ALD sequence for comparison.

Next, as an example of the film forming operation by the ALD method will be explained based on a case wherein an $Al_2O_3$ film is formed using TMA, $O_3$ gas and $O_2$ plasma. FIG. 3 is a diagram for explaining the ALD sequence of the embodiment. FIG. 4 is a diagram for explaining the ALD sequence for comparison.

First, semiconductor silicon wafers 200 on which films are to be formed are set in the boat 217, and the boat 217 is brought into the processing furnace 202. After the boat 217 is brought into the processing furnace 202, the following five steps are carried out in sequence.

[Step 1]

In step 1, a TMA gas is flown. TMA is liquid at ordinary temperatures. To supply the TMA gas to the processing furnace 202, there are a method in which the TMA gas is heated and vaporized and then supplied to the processing furnace 202, and a method in which inert gas called carrier gas such as nitrogen and noble gas is sent into a TMA container 260, and vaporized TMA gas is supplied to the processing furnace together with the carrier gas. This embodiment will be explained based on the later method. First, the valve 252 provided on the carrier gas supply tube 232b, the valve 250 provided between the TMA container 260 and the processing furnace 202, and the valve 243d provided on the gas exhaust tube 231 are opened, carrier gas whose flow rate is adjusted by the mass flow controller 241b is supplied from the carrier gas supply tube 232b through the TMA container 260 to be a mixture gas of TMA and the carrier gas, and the mixture gas is supplied to the processing chamber 201 from the gas supply holes 248c of the gas supply section 249, and in this state the gas is exhausted from the gas exhaust tube 231. When flowing the TMA gas, the valve 243d is appropriately adjusted, and the pressure in the processing chamber 201 is maintained at a predetermined pressure in a range of 10 to 900 Pa. A supply flow rate of the carrier gas controlled by the mass flow controller 241b is 10,000 sccm or less. The supply time of TMA is set to 1 to 4 seconds. Then, time during which the wafer is exposed to the increased pressure atmosphere for further adsorption may be set to 0 to 4 seconds. The temperature of the heater 207 at that time is set such that the temperature of the wafers becomes 250 to 450° C.

If the open/close valve 254 is opened from a line 232d of inert gas connected to an intermediate portion of the gas supply tube 232a to allow inert gas to flow, wraparound of TMA toward the $O_3$ side can be prevented.

At that time, only inert gas such as TMA, $N_2$ and Ar flow into the processing chamber 201, and $O_3$ does not exist. Therefore, TMA does not generate vapor-phase reaction, and the TMA surface-reacts with a foundation film on the wafer 200.

[Step 2]

In step 2, the valve 250 of the gas supply tube 232b is closed to stop the supply of TMA. The valve 243d of the gas exhaust tube 231 is left open, the processing chamber 201 is evacuated by the vacuum pump 246 to 20 Pa or lower, and remaining TMA is exhausted from the processing chamber 201. At that time, simultaneously the open/close valve 253 is opened to flow $N_2$ gas as inert gas from the line 232c of inert gas connected to an intermediate portion of the gas supply tube 232b, and the open/close valve 254 is opened to flow $N_2$ gas as inert gas from the line 232d of inert gas connected to an intermediate portion of the gas supply tube 232a and $N_2$ gas is flown into the processing chamber 201.

[Step 3]

In step 3, $O_3$ gas is flown. First, the valve 243a provided on the gas supply tube 232a and the valve 243d provided on the gas exhaust tube 231 are both opened, $O_3$ gas whose flow rate is adjusted by the mass flow controller 241a is supplied from the gas supply tube 232a into the processing chamber 201 from the gas supply holes 248a of the buffer chamber 237, and simultaneously the gas is evacuated from the gas exhaust tube 231. When the $O_3$ gas is flown, the valve 243d is appropriately adjusted, and the pressure in the processing furnace 202 is maintained at a predetermined pressure in a range of 10 to 100 Pa. A supply flow rate of $O_3$ controlled by the mass flow controller 241a is in a range of 1,000 to 10,000 sccm. Time during which the wafers 200 are exposed to $O_3$ is 2 to 120 seconds. The temperature of the wafer at that time is the same as the temperature when TMA is supplied and is in a range of 250 to 450° C.

If the open/close valve 253 is opened from the line 232c of inert gas connected to an intermediate portion of the gas supply tube 232b to allow inert gas to flow, wraparound of $O_3$ gas toward the TMA side can be prevented.

At that time, only inert gas such as $O_3$, $N_2$ and Ar flow into the processing furnace 202, and TMA does not exist. Therefore, $O_3$ does not generate a vapor-phase reaction, and $O_3$ surface reacts with a foundation film formed by adsorption of TMA on the wafer 200, and an $Al_2O_3$ film is formed on the wafer 200.

[Step 4]

In step 4, the valve 243a of the gas supply tube 232a is closed to stop the supply of $O_3$ gas. The valve 243d of the gas exhaust tube 231 is left open, the processing chamber 201 is evacuated by the vacuum pump 246 to 20 Pa or lower, and residual $O_3$ is exhausted from the processing chamber 201. At that time, simultaneously the open/close valve 254 is opened to flow $N_2$ gas as inert gas from the line 232d of inert gas connected to an intermediate portion of the gas supply tube 232a, and the open/close valve 253 is opened to flow $N_2$ gas as inert gas from the line 232c of inert gas connected to an intermediate portion of the gas supply tube 232b and $N_2$ gas is flown into the processing chamber 201.

[Step 5]

In step 5, the open/close valve 254 of the line 232d of inert gas and the open/close valve 253 of the line 232c of inert gas are closed to stop the supply of $N_2$ gas. The valve 255 provided on the gas supply tube 232e is opened, and $O_2$ gas whose flow rate is adjusted by the mass flow controller 241e is sent from the gas supply tube 232e into the buffer chamber 237 from the gas supply holes 248b of the nozzle 233. High frequency electric power is applied between the rod-like electrode 269 and the rod-like electrode 270 from the high frequency power supply 273 through the matching device 272, $O_2$ is plasma-excited and this is supplied to the processing chamber 201 as active species and simultaneously the gas is exhausted from the gas exhaust tube 231. When $O_2$ gas flows as the active species by plasma-exciting the $O_2$ gas, the valve 243d is appropriately adjusted and the pressure in the processing chamber 201 is maintained at a predetermined pressure in a range of 10 to 900 Pa. A supply flow rate of $O_2$ controlled by the mass flow controller 241e is a predetermined flow rate in a range of 1 to 10,000 sccm. Time during which the wafer 200 is exposed to active species obtained by plasma-exciting $O_2$ is in a range of 0.1 to 600 sec. The temperature of the heater 207 at that time is set equal to an AlO film forming temperature.

Then, the valve 255 of the gas supply tube 232e is closed to stop the supply of $O_2$ gas, and application of the high frequency electric power from the high frequency power supply 273 is also stopped. The valve 243d of the gas exhaust tube 231 is left open, the processing chamber 201 is evacuated by the vacuum pump 246 to 20 Pa or lower, and residual $O_2$ gas is exhausted from the processing chamber 201. At that time, simultaneously the open/close valve 254 is opened to flow $N_2$ gas as inert gas from the line 232d of inert gas connected to an intermediate portion of the gas supply tube 232a, and the open/close valve 253 is opened to flow $N_2$ gas as inert gas from the line 232c of inert gas connected to an intermediate portion of the gas supply tube 232b and $N_2$ gas is flown into the processing chamber 201.

The above steps 1 to 5 are defined as one cycle, and this cycle is repeated a plurality of times, thereby forming the $Al_2O_3$ films having a predetermined thickness on the wafers 200 (see FIG. 3).

Figure 5:
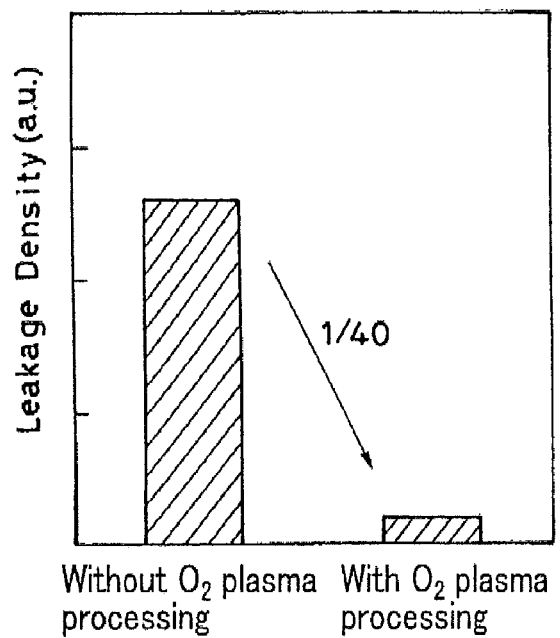
FIG. 5 is a diagram for explaining $O_2$ plasma processing effect on an ALO film in the first embodiment of the present invention.

FIG. 5 shows a result of measurement of leak current of a capacitor film using an $Al_2O_3$ film produced by this embodiment and leak current of a capacitor film using $Al_2O_3$ formed on a wafer 200 only by repeating the cycle (steps 1 to 4) a plurality of times without carrying out the processing using $O_2$ plasma as shown in FIG. 4. It can be found that if the $O_2$ plasma processing is carried out, the leak current is remarkably reduced. If the $O_2$ plasma processing is carried out, it is possible to reduce the leak current, and to reduce EOT (Equivalent Oxide Thickness: film thickness converted into oxide film: film thickness when film is converted into oxide film based on dielectric constant).

It is preferable that the steps 1 to 5 are defined as one cycle, and the $O_2$ plasma processing is carried out whenever one atomic layer is formed by the ALD method by repeating the cycle a plurality of times, but it is also possible to carry out the $O_2$ plasma processing whenever two to five atomic layers are formed by the ALD method. It is not preferable to carry out the $O_2$ plasma processing whenever six or more atomic layers are formed because impurities such as carbon compound are not eliminated easily even if the $O_2$ plasma processing is carried out.

In the present embodiment, $O_2$ gas is supplied from the gas supply tube 232e and the $O_2$ plasma processing is carried out, but $N_2O$, NO, $NO_2$ or $H_2O$ may be supplied from the gas supply tube 232e instead of $O_2$ gas and the plasma processing may be carried out. Further, Ar or $N_2$ may be used in the plasma processing.

Second Embodiment

When a capacitor film is to be formed, an Si surface is nitrided and then an alumina film ($Al_2O_3$ film) is formed. In this embodiment, as a method for forming a foundation of the alumina film, plasma nitriding is carried out.

Figure 6:
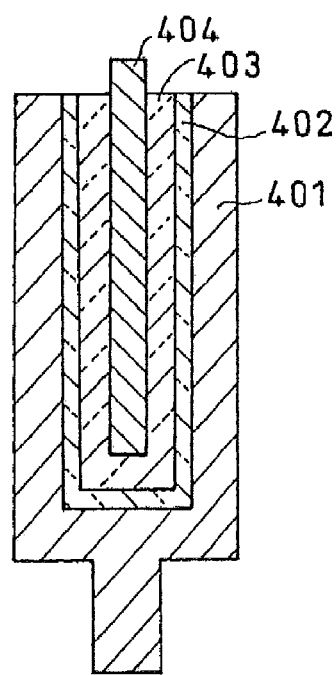
FIG. 6 is a schematic vertical sectional view for explaining a capacitor structure to which plasma nitriding processing is applied according to a second embodiment of the present invention.

As shown in FIG. 6, the same apparatus as that of the embodiment 1 is used. the valve 255 provided to the gas supply tube 232e is first opened, $NH_3$ gas whose flow rate is adjusted by the mass flow controller 241e is ejected from the gas supply tube 232e into the buffer chamber 237 through the gas supply holes 248b of the nozzle 233, high frequency electric power is applied between the rod-like electrode 269 and the rod-like electrode 270 from the high frequency power supply 273 through the matching device 272 to plasma-excite $NH_3$, which is supplied into the processing chamber 201 as a active species and in this state, the gas is exhausted from the gas exhaust tube 231. In this manner, a barrier SiN film 402 is formed on a doped polycrystalline silicon 401.

Then, the steps 1 to 4 are defined as one cycle, and the cycle is repeated a plurality of times, thereby forming the $Al_2O_3$ film 403 on the barrier SiN film 402 by the ALD method. Thereafter, a TiN 404 is formed and a capacitor is prepared.

Figure 7:
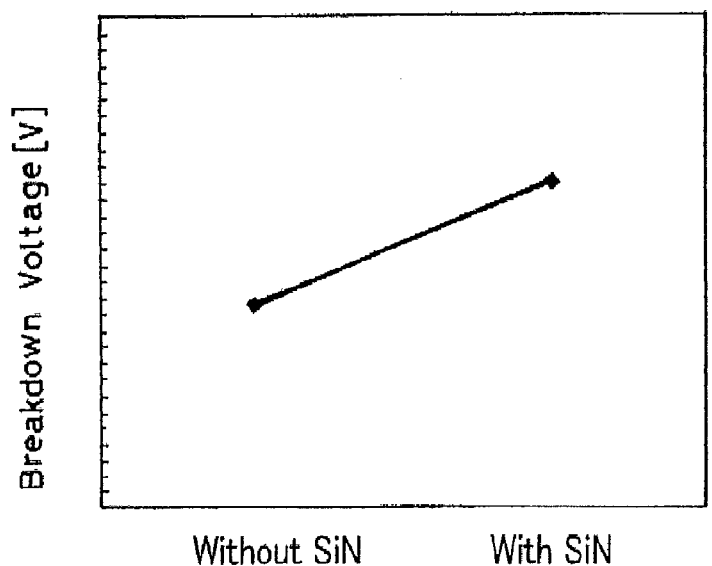
FIG. 7 is a diagram for explaining an effect of the plasma nitriding processing in the second embodiment of the present invention.

FIG. 7 shows breakdown voltages of a capacitor formed in the above-described manner and a capacitor prepared by forming the $Al_2O_3$ film 403 directly on the doped polycrystalline silicon 401 without forming the barrier SiN film 402. It can be found that the capacitor using the barrier SiN film 402 formed as in this embodiment has extremely high breakdown voltage.

Although $NH_3$ gas is supplied from the gas supply tube 232e and the $NH_3$ is plasma-excited to form the barrier SiN film 402 in the present embodiment, $N_2$ gas may be supplied from the gas supply tube 232e and $N_2$ may be plasma-excited to form the barrier SiN film 402.

Third Embodiment

In the embodiment, a surface of an oxide film formed by the ALD method is subjected to plasma nitriding processing. As nitriding processing of an oxide film of a liner portion of a gate spacer or STI (Shallow Trench Isolation), thermal processing is conventionally carried out at about 800 to 900° C. using oxidizer such as NO and $N_2O$. Nitrogen distribution, however, is concentrated on an interface between $SiO_2$ and Si, which results in lowering mobility, and thus, a technique for plasma nitriding the $SiO_2$ surface has been desired.

Figure 8:
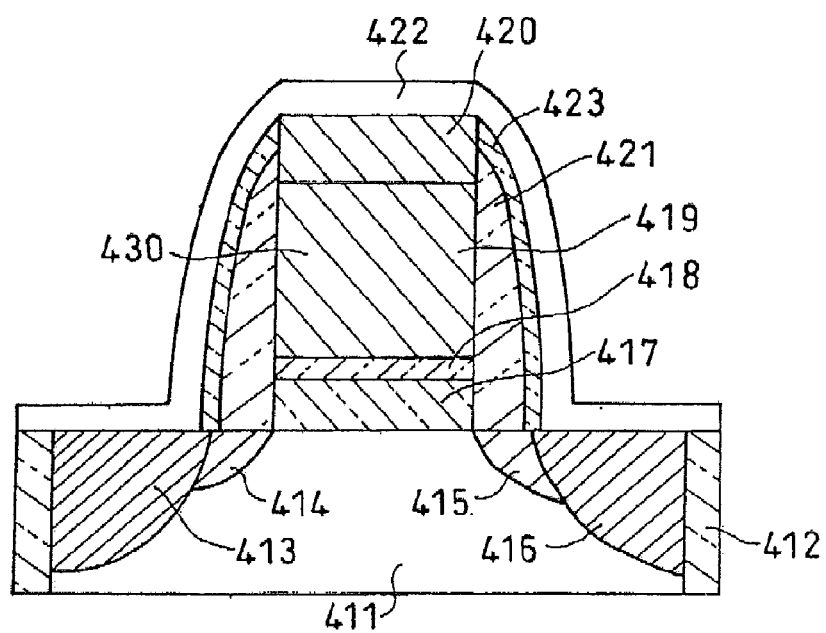
FIG. 8 is a schematic vertical sectional view for explaining a gate spacer to which a third embodiment of the present invention is applied.

A MOS transistor which is one kind of semiconductor devices which are preferably prepared by applying the present embodiment will be explained with reference to FIG. 8. This MOS transistor is formed in a region surrounded by an element isolator 412 formed in a silicon layer 411. A gate electrode 430 including a doped polycrystalline silicon 419 and a metal silicide 420 is formed on an oxide film 417 formed on the silicon layer 411 and a plasma nitride film 418. A gate spacer 421 made of $SiO_2$ is formed on a sidewall of the gate electrode 430, and a plasma nitride film 423 is formed on the gate spacer 421. The silicon layer 411 is formed with sources 413 and 414 as well as drains 415 and 416 such as to sandwich the gate electrode 430. An insulation film 422 is formed such as to cover the MOS transistor formed in this manner.

Figure 9:
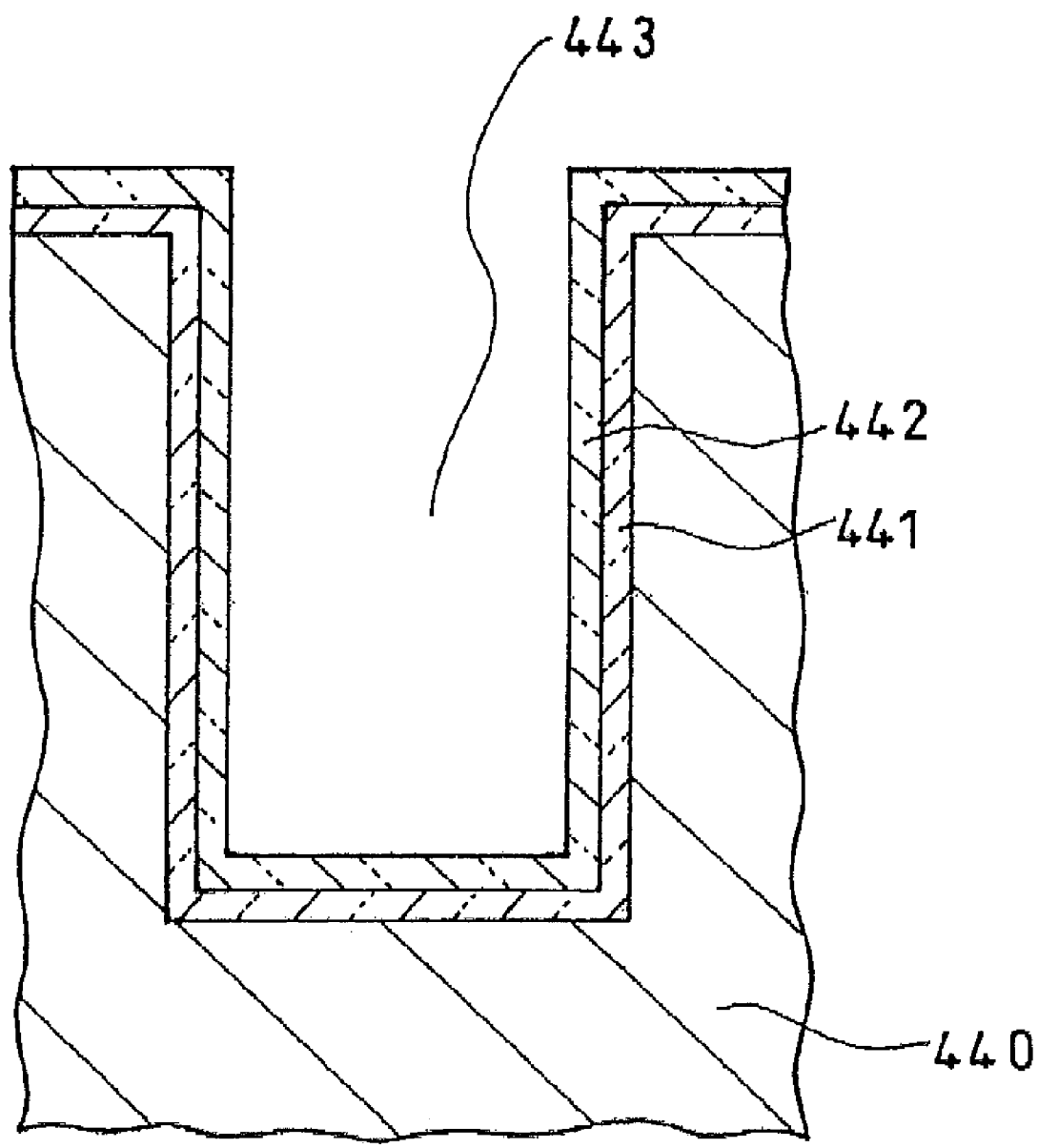
FIG. 9 is a schematic vertical sectional view for explaining a liner of STI (Shallow Trench Isolation) to which the third embodiment of the present invention is applied.

Next, a liner portion of the STI (Shallow Trench Isolation) which is preferably formed by applying the present embodiment will be explained with reference to FIG. 9. A silicon layer 440 is formed with a groove 443, and an oxide film 441 made of $SiO_2$ is formed on the silicon layer 440. A plasma nitride film 442 is formed on the oxide film 441. A groove 443 is to be filled with an oxide film (not shown) to form the element isolation region, and the plasma nitride film 442 is formed before the oxide film is formed so that the oxidation does not spread.

In the present embodiment, the same apparatus as that of the first embodiment was used, TMA in the first embodiment was replaced by DCS (dichlorosilane: $SiH_2Cl_2$), and $O_2$ in the first embodiment was replaced by $NH_3$, respectively. In the case of the MOS transistor, DCS and $O_3$ were alternately supplied to form a gate spacer 421 having a desired thickness by the ALD method and then, a surface of the gate spacer 421 was plasma nitrided by $NH_3$ plasma to form the plasma nitride film 423. In the case of STI, DCS and $O_3$ were alternately supplied to form an oxide film 441 by the ALD method, and a surface of the oxide film 441 was plasma nitrided to form a plasma nitride film 442.

Figure 10:
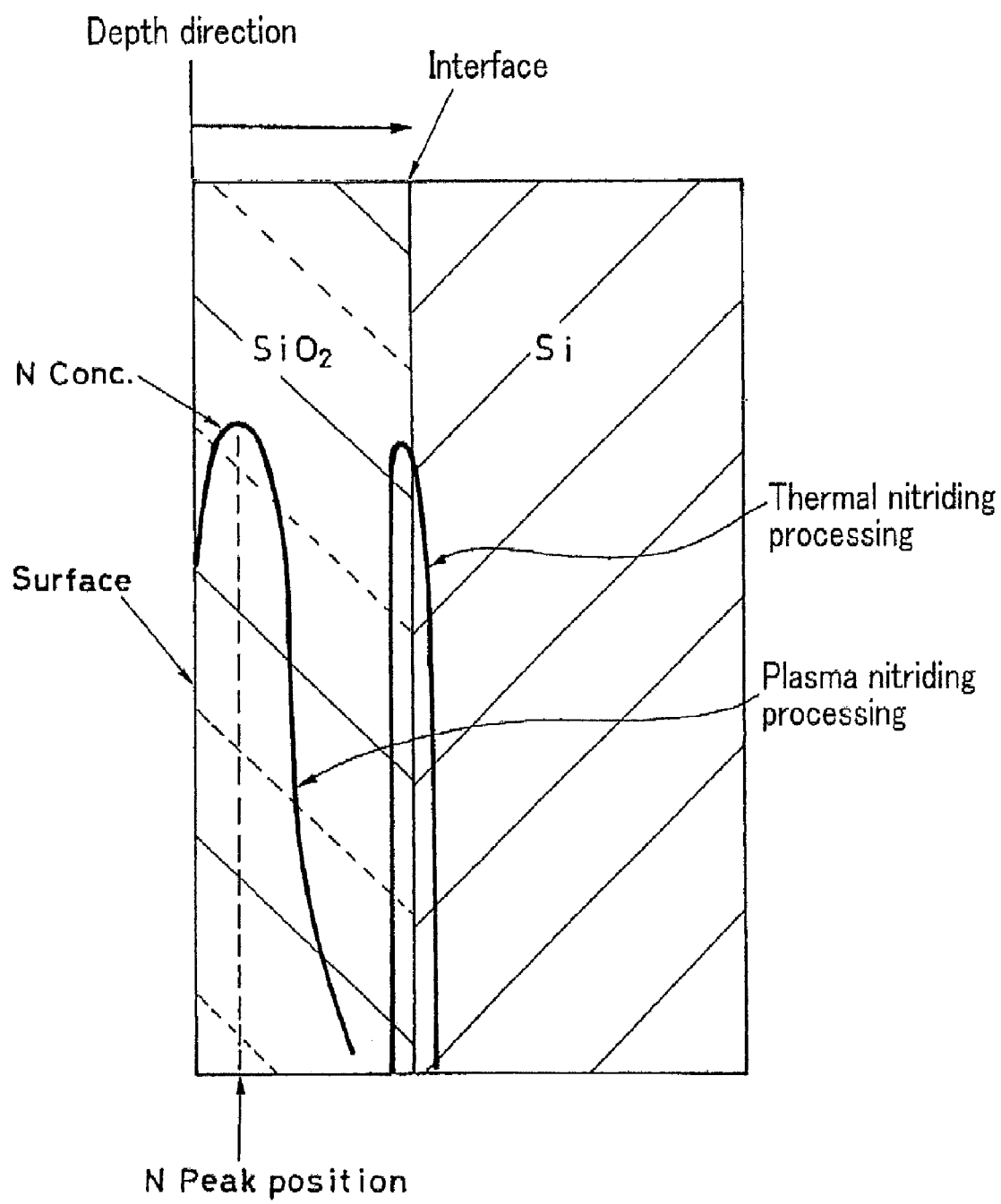
FIG. 10 is a diagram for explaining nitride profiles of plasma nitriding processing and thermal nitriding in the third embodiment of the present invention.

In the present embodiment, the surface of the $SiO_2$ is plasma nitrided in this manner. FIG. 10 shows a nitrogen profile when the surface is subjected to thermal nitriding processing and the processing of the present embodiment. In the present embodiment, nitrogen does not exist almost at all at an interface between Si and $SiO_2$ at the time of low temperature processing at 600° C. or lower and there is a peak of nitrogen concentration near the surface of the $SiO_2$, which shows that the surface of the $SiO_2$ can be nitrided.

Although $NH_3$ gas is supplied and $NH_3$ is plasma-excited to form the plasma nitride film in the present embodiment, $N_2$ gas may be supplied and $N_2$ may be plasma-excited to form the plasma nitride film.

Fourth Embodiment

To form a silicon nitride film on a Si wafer by the ALD method, $NH_3$ and DCS ($SiH_2Cl_2$) are used as raw materials.

Film forming procedure will be shown below.
(1) A Si wafer is transferred onto a quartz boat.
(2) The quartz boat is inserted into a processing chamber having a temperature of 300° C.
(3) When the insertion of the quartz boat is completed, the processing chamber is evacuated, and the temperature in the processing chamber is increased to about 450° C.
(4) DCS irradiation (three seconds)→$N_2$ purging (five seconds)→plasma-excited $NH_3$ irradiation (six seconds)→$N_2$ purging (three seconds) are defined as one cycle, and this cycle is repeated until a predetermined film thickness is obtained. At that time, the thickness of the film formed every one cycle is about 1 Å(=0.1 nm).
(5) The reaction gas in the processing chamber is exhausted and the temperature in the processing chamber is lowered to about 300° C. at the same time.
(6) The pressure in the processing chamber is returned to the atmospheric pressure, and the quartz boat is pulled out from the processing chamber.

In semiconductor device structures of recent years, a film stress of about 1.8 Gpa is required for moderating distortion, but film stress of the film formed through the above-described steps is about 1.2 Gpa, which is lower than the target value.

Figure 11:
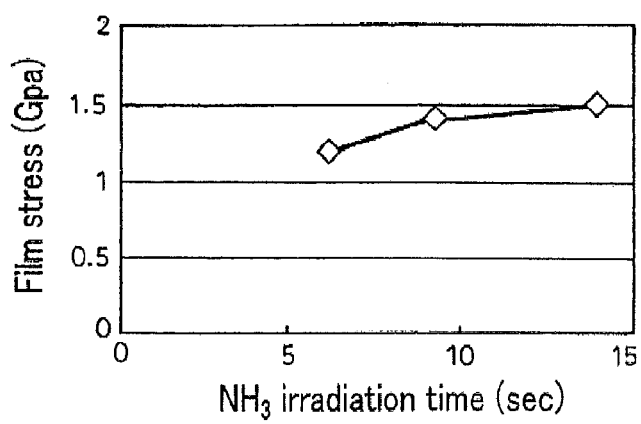
FIG. 11 is a diagram showing a relation between $NH_3$ irradiation time and a film stress.

Therefore, a technique for increasing the $NH_3$ irradiation time to increase the stress has been employed. It is possible to increase the film stress up to 1.5 Gpa by increasing the $NH_3$ irradiation time. FIG. 11 shows a result of the film stress when the $NH_3$ irradiation time is increased. Although the film stress is increased by increasing the irradiation time of excited $NH_3$, stress of 1.5 Gpa or more can not be obtained.

As stated above, according to the conventional technique of increasing $NH_3$ irradiation time, the maximum value of the obtained film stress is 1.5 Gpa, and it is not possible to achieve the target 1.8 Gpa. If the film stress of a nitride film of the transistor section is low, there arise problems including lowering of ON current.

In the present embodiment, the same apparatus as that of the first embodiment was used, with TMA in the first embodiment replaced by DCS (dichloro-silane: $SiH_2Cl_2$), $O_3$ replaced by $NH_3$ radical and $O_2$ replaced by $H_2$, respectively. Then, DCS and $NH_3$ radical were alternately supplied to form an $Si_3N_4$ film with a desired thickness by the ALD method, and then, the film stress of the $Si_3N_4$ film was further improved by plasma of $H_2$.

A reaction mechanism of the ALD method will be explained below.
(1) First, Si and Cl are adsorbed on a surface by DCS irradiation.
(2) Next, $N_2$ purge is carried out for replacing the gas (to prevent DCS and $NH_3$ from being mixed with each other).
(3) Irradiation of excited $NH_3$ is carried out, to eliminate Cl adsorbed in (1) as HCl, and to allow N and H to be adsorbed.

A cycle of (1) to (3) is repeated until a film thickness reaches a predetermined value.

As a consequence, in addition to Si and N which are main ingredients of the ALD nitride film, impurities of H and Cl are taken into the film.

Figure 12:
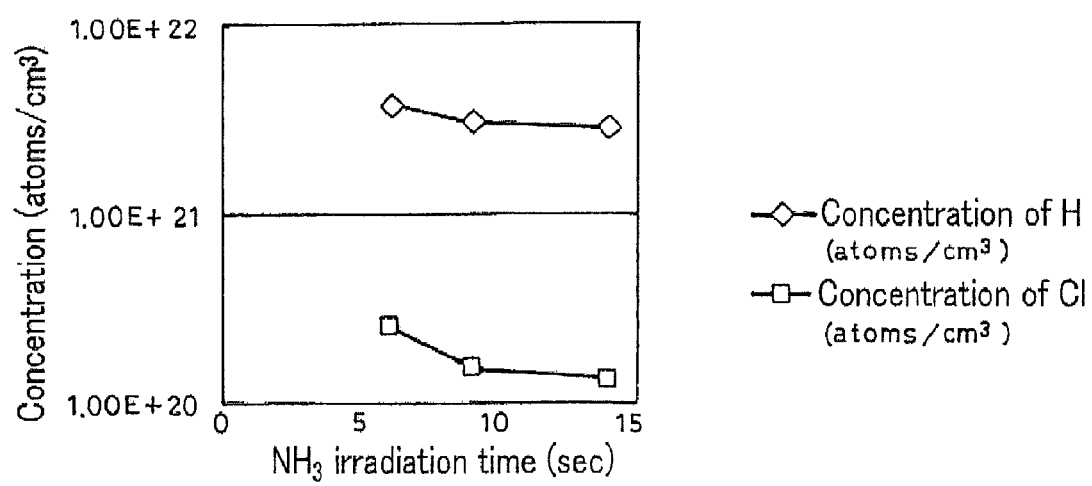
FIG. 12 is a diagram showing a relation between the $NH_3$ irradiation time and concentrations of Cl and H in a film.

FIG. 12 shows a result of measurement of concentrations of H (hydrogen) and Cl (chlorine) in the film using a SIMS (Secondary Ion Mass Spectrometry). It is found that if the $NH_3$ irradiation time is increased, the concentration of H is constant but the concentration of Cl is lowered.

Although Cl is taken into a surface from DCS which is a raw material of Cl, Cl is eliminated from the surface in a process of irradiation of $NH_3$. Therefore, the $NH_3$ irradiation time is longer, the eliminating effect of Cl is higher, resulting in reducing the concentration of Cl in the film. However, the concentration of Cl can not be reduced to 1E20 ($1\times10^{20}$) atoms/cm$^3$ or lower.

A technique for further lowering the concentration of Cl was researched on with the assumption that the film stress depends on the concentration of Cl. When DCS is supplied, Si—Cl bond and Si—H bond exist on a film surface. Concerning bonding energy of each of the bonds, the Si—Cl bond has 397 KJ/mol and the Si—H bond has 318 KJ/mol and thus, the Si—Cl bond has higher energy. If the film is irradiated with NH$_3$ radical, the Si—H bond is replaced by N—H bond, but since the bonding energy of Si—Cl is high, the film formation proceed in a state where Cl is included.

To remove the Cl, an experiment for eliminating Cl in a form of HCl using H$_2$ plasma was carried out.

Figure 13:
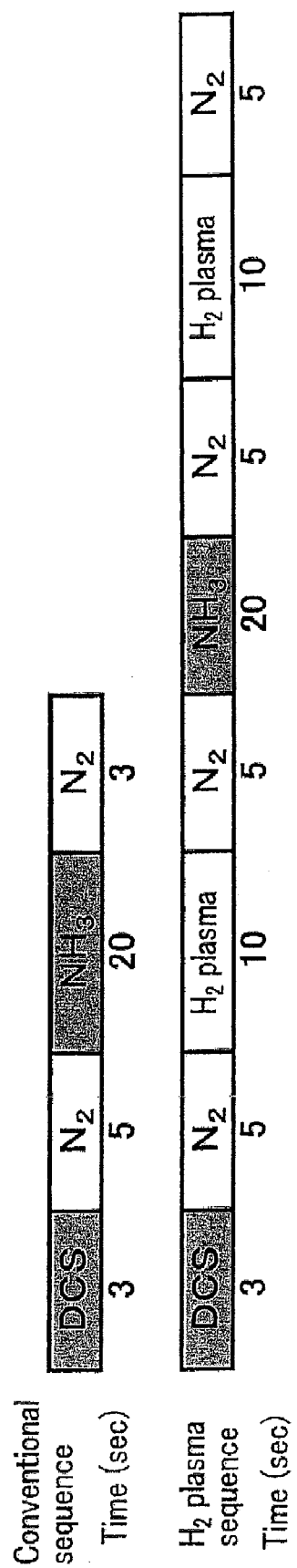
FIG. 13 is a diagram for explaining a sequence of a conventional ALD film forming method and a sequence of an ALD film forming method using $H_2$ plasma of a fourth embodiment.

FIG. 13 shows a sequence of the conventional ALD film forming method and a sequence of the ALD film forming method using H$_2$ plasma according to the present embodiment. In both cases, irradiation time of excited NH$_3$ is increased to 20 sec. In the case of the ALD film formation using H$_2$ plasma, the irradiation time of H$_2$ plasma is 10 sec.

FIG. 14 shows a result of an analysis of the SIMS regarding the concentration of Cl in films when films are formed by the conventional ALD film forming method and when films are formed by the ALD film forming method of the present embodiment using H$_2$ plasma, and shows film stress with respect to the sequence of the conventional ALD film forming method.

From the result of the analysis of the SIMS, it can be found that the concentration of Cl in the film can be reduced if H$_2$ plasma is used.

From the result of measurement of the film stress, it is found that if H$_2$ plasma is used, the film stress can be increased 1.3 times.

Here, as shown in FIG. 13, the H$_2$ plasma processing is carried out every cycle, but the same effect can be obtained even if the H$_2$ plasma processing is carried out once in two or more cycles as shown in FIG. 15. FIG. 14 shows a result of the H$_2$ plasma processing carried out once in five cycles and ten cycles. In these cases also, it can be found that the concentration of Cl in the film is reduced and the film stress is improved. If the interval of the applications of the H$_2$ plasma processing is adjusted between one to ten cycles, the film stress can vary.

In FIG. 13, the N$_2$ purge steps are provided before and after the irradiation of NH$_3$ radical, but the N$_2$ purge steps may be omitted. Since H$_2$ plasma is generated in the H$_2$ plasma irradiation step and the NH$_3$ radical irradiation step, it is unnecessary to remove HN$_2$ by N$_2$ purge. This is also because that even if electric discharge is thinly turned ON and OFF, it can keep standing.

In FIG. 13, H$_2$ plasma irradiation is carried out whenever the film is irradiated with either one of DCS and NH$_3$, the film may be irradiated with H$_2$ plasma only once after irradiation of NH$_3$ (i.e. irradiated with H$_2$ plasma every one cycle).

In view of the above result, the same apparatus as that of the first embodiment was used, with TMA in the first embodiment replaced by DCS (dichloro-silane: SiH$_2$Cl$_2$), O$_3$ replaced by NH$_3$ radical and O$_2$ replaced by H$_2$, respectively. Then, DCS and NH$_3$ radical were alternately supplied to form an Si$_3$N$_4$ film by the ALD method and then, the Si$_3$N$_4$ film was further reformed by plasma of H$_2$.

Fifth Embodiment

In the present embodiment, the same apparatus as that of the first embodiment was used, with TMA in the first embodiment replaced by DCS (dichloro-silane: SiH$_2$Cl$_2$), and O$_3$ replaced by NH$_3$ radical and O$_2$ replaced by N$_2$, respectively. Then, DCS and NH$_3$ radical were alternately supplied to form Si$_3$N$_4$ film by the ALD method and then, the Si$_3$N$_4$ film was further reformed by plasma of N$_2$.

To form a silicon nitride film on an Si wafer by the ALD method, NH$_3$ and DCS (SiH$_2$Cl$_2$) are used as raw materials.

Film forming procedure will be shown below.

(1) An Si wafer is transferred onto a quartz boat.

(2) The quartz boat is inserted into a processing chamber having a temperature of 300° C.

(3) When the insertion of the quartz boat is completed, the processing chamber is evacuated, and the temperature in the plasma processing is increased to about 450° C.

(4) DCS irradiation (three seconds)→N$_2$ purging (five seconds)→plasma-excited NH$_3$ irradiation (six seconds)→N$_2$ purging (three seconds) are defined as one cycle, and this cycle is repeated until a predetermined film thickness is obtained. At that time, the thickness of the film formed every one cycle is about 1 Å(=0.1 nm).

(5) The reaction gas in the processing chamber is exhausted and the temperature in the processing chamber is lowered to about 300° C. at the same time.

(6) The pressure in the processing chamber is returned to the atmospheric pressure, and the quartz boat is pulled out from the processing chamber.

In a film formed through the above steps, about 3E10 ($3\times10^{10}$)(atoms/cm$^3$) of Na is included per 100 Å. The concentration of Na was measured using ICPMS (inductive coupling plasma mass analysis method. The value 3E10 ($3\times10^{10}$) is not permitted in the semiconductor industries of recent years and it is necessary to lower this value.

If Na enters an oxide film of a MOS transistor, this indisposes control by a gate of transistor output current. Therefore, it is necessary to lower the concentration of Na. In general, a value of about 1E10 (atoms/cm$^3$) is required.

When a film is formed by the ALD method and a film is formed by a LPCVD (Low Pressure Chemical Vapor Deposition) method using the same processing chamber, if the concentrations of Na in the formed films are compared with each other, the detection of Na in the film formed by the LPCVD method is much smaller. FIG. 16 shows the concentrations of Na in the formed films. The left sides show concentrations of Na when films are formed by the ALD method under a condition that high frequency electric power is 300 W and the NH$_3$ irradiation time is 30 seconds. The right side shows concentration of Na when the film is formed by the LPCVD method at 760° C. In the figure, "TOP" means Si wafer mounted on an upper portion of the quartz boat, "Center" means Si wafer mounted on an intermediate portion of the quartz boat, and "Bottom" means Si wafer mounted on a lower portion of the quartz boat. Referring to FIG. 16, it can be found that the detection of Na in the case of the LPCVD is remarkably smaller.

The ALD method and the CVD method are largely different from each other in that in the ALD method, NH$_3$ ionized using plasma and DCS flow alternately, but in the CVD method, DCS and not-ionized NH$_3$ flow at the same time.

Focusing on the ionized gas, such a hypothesis is made that Na exists in an ionized state of Na$^+$ in a reaction form of Na.

From the comparison between the ALD method and the CVD method, it can be determined that Na is not generated from a gas supply system or a dummy wafer.

Figure 17:
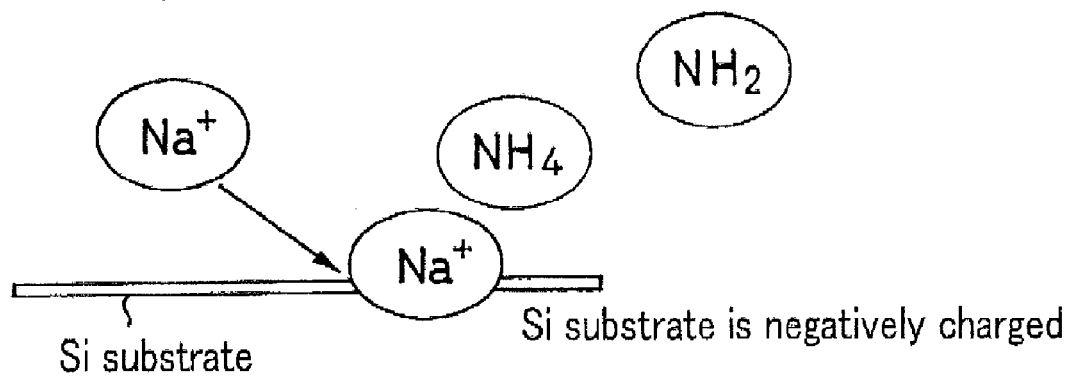
FIG. 17 is a diagram showing a model into which Na existing in a Na state is taken in the case of irradiation of $NH_3$ plasma.

A model in which Na existing in a state of Na$^+$ in the reaction form is taken into a film is considered as shown in FIG. 17.

It is assumed that during irradiation of NH$_3$ ionized by plasma, two kinds of ionized gases, i.e., NH$_4^-$ (negatively charged) and $NH_2^+$ (positively charged) exist on a surface of a Si wafer. Since $Na^+$ is attracted by $NH_4^-$, $Na^+$ can easily be adsorbed in the presence of $NH_4^-$. That is, while plasma is generated, the Na is prone to be adsorbed.

The following is data attesting to this fact.

Figure 19:
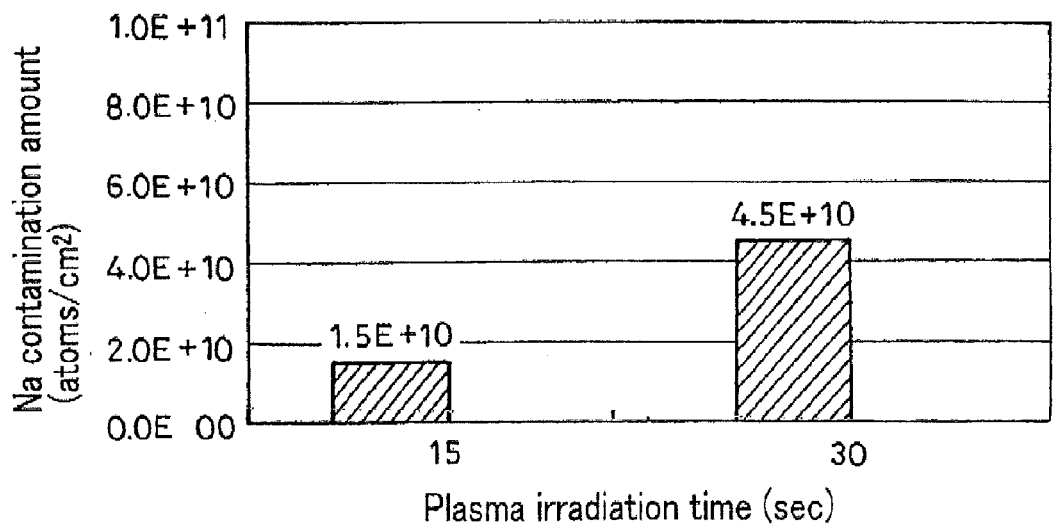
FIG. 19 is a diagram showing a relation between plasma irradiation time and a concentration of Na in a film.

(1) FIG. 19 shows a result of the comparison of concentrations of Na in films by dependency of plasma irradiation time. It can be found that as the plasma time is longer, the concentration of Na becomes higher. That is, since the existing time of $NH_4^-$ is long, the amount of adsorbed Na is high.

Figure 20:
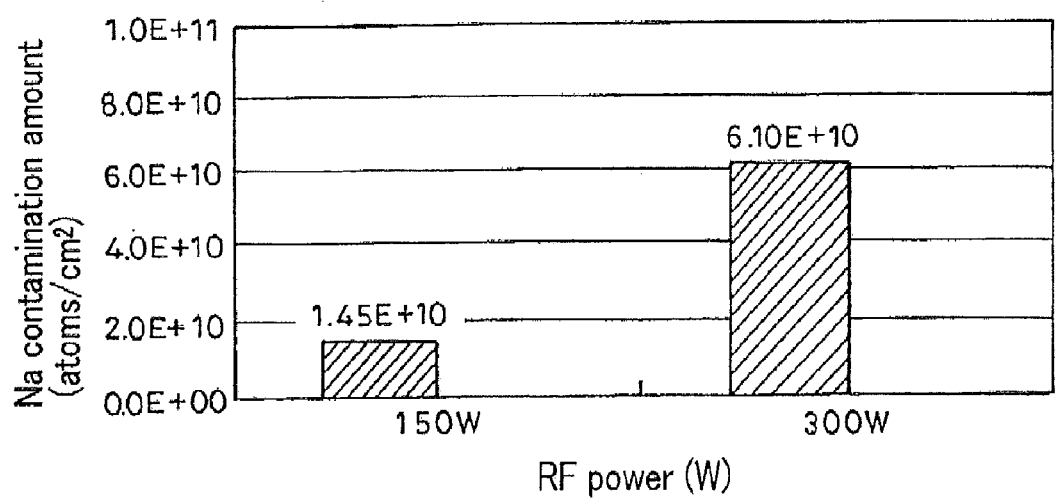
FIG. 20 is a diagram showing a relation between a concentration of Na and plasma-exciting high frequency (RF) power.

(2) FIG. 20 shows a result of the comparison of concentrations of Na in films by dependency of high frequency (RF) power. It can be found that as the high frequency (RF) power is higher, the concentration of Na becomes higher. That is, if the existing amount of $NH_4^-$ is higher, the amount of adsorbed Na becomes higher.

Figure 21:
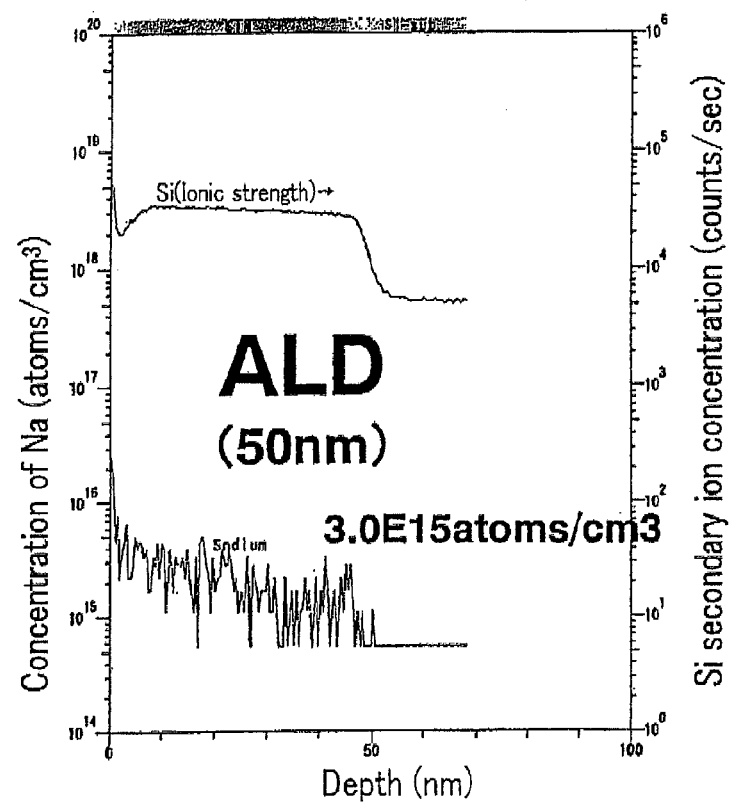
FIG. 21 is a diagram showing a result of measurement of distribution of concentration of Na by SIMS in a film formed by an ALD method.
Figure 22:
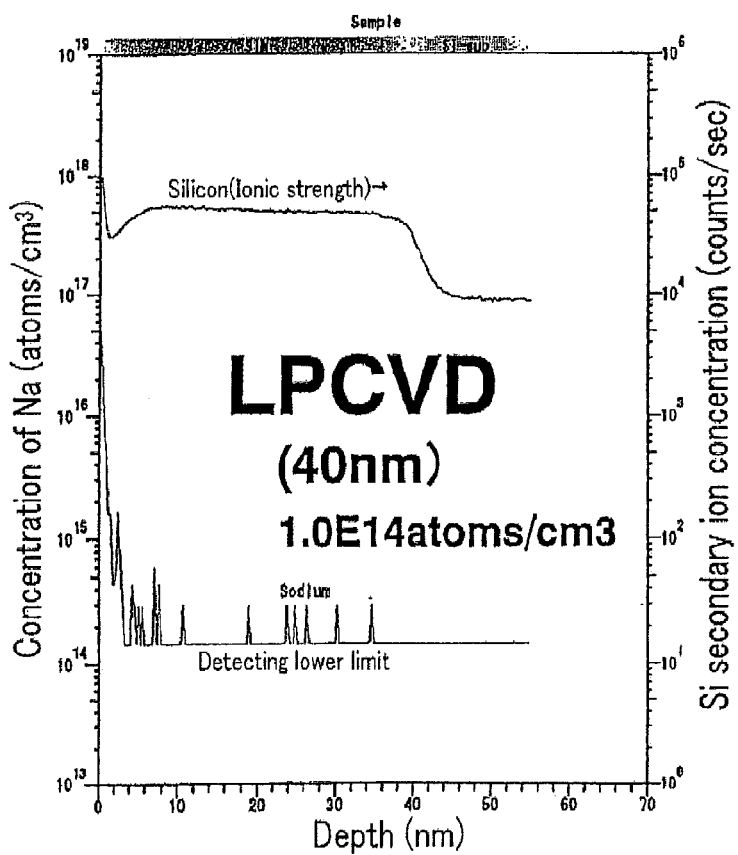
FIG. 22 is a diagram showing a result of measurement of distribution of concentration of Na by SIMS in a film formed by a LPCVD method.

(3) FIG. 21 shows a result of concentration distribution of Na in a film by SIMS. It can be found that Na is equally distributed in the film. FIG. 22 shows a result of concentration distribution by SIMS of Na in a film formed by the LPCVD method. It can be found that concentration of Na is remarkably low in the LPCVD.

From the above results, it can be found that although the location where Na is generated is not specified (it can also be conceived that Na is generated from an electrode which carries out plasma discharge), a mode shown in FIG. 17 in which Na is taken into a film is valid.

Figure 18:
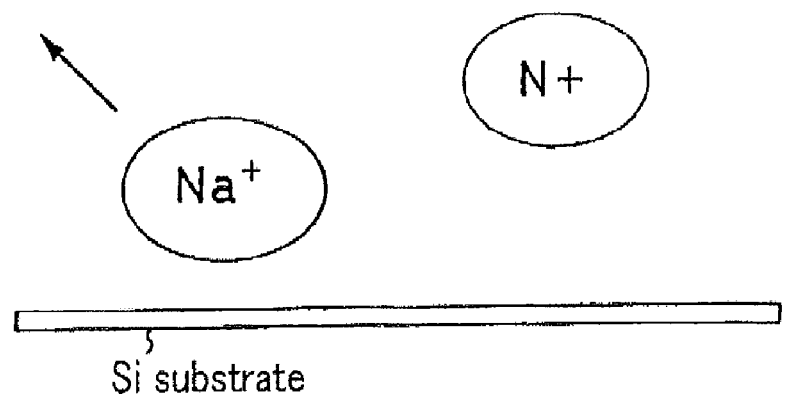
FIG. 18 is a diagram showing a model from which Na existing in a $Na^+$ state is removed in the case of irradiation of $N_2$ plasma.

In view of the above results, as a countermeasure for reducing an amount of Na taken into a film, a technique for removing the adsorbed Na was considered. To remove Na, it is considered that irradiation of ionized gas, which is positively charged, after adsorption of Na is effective. As the positively charged ionized gas, $N_2$ was selected. It is assumed that $N_2$ is generating ionized gas of $N^+$ by ionization. It is conceived that $Na^+$ is repelled by $N^+$ and detached. See FIG. 18.

Figure 25:
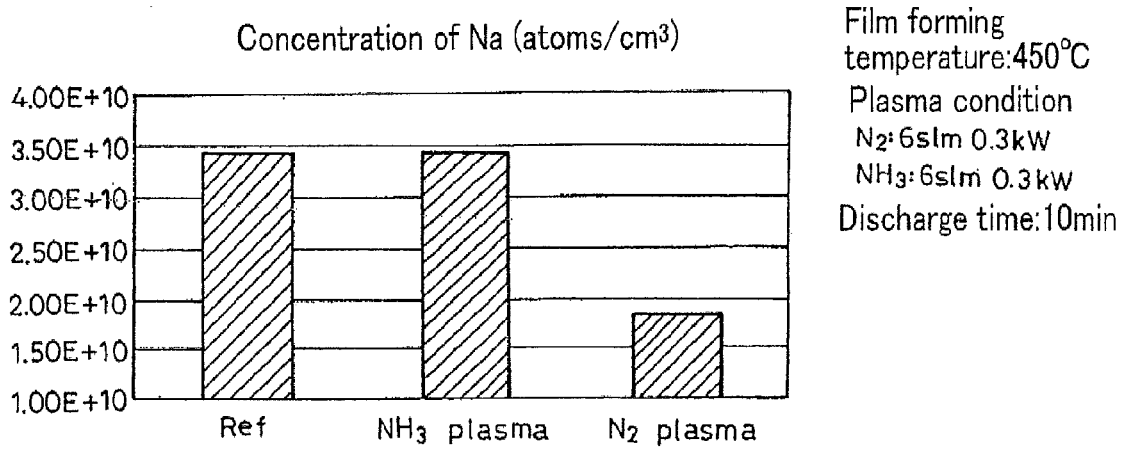
FIG. 25 is a diagram showing concentrations of Na in films when an intentionally Na-contaminated wafer is irradiated with $NH_3$ plasma and when an intentionally Na-contaminated wafer is irradiated with $N_2$ plasma.

FIG. 25 shows a result of the experiment. In FIG. 25, a case in which a wafer which has been intentionally contaminated by Na (corresponding to "Ref" in the drawing) is irradiated with $NH_3$ plasma and a case in which the wafer is irradiated with $N_2$ plasma are compared with each other. As a result, the concentration of Na was reduced by the irradiation of $N_2$ plasma, and it is conceived that the irradiation of $N_2$ plasma is effective.

Figure 23:
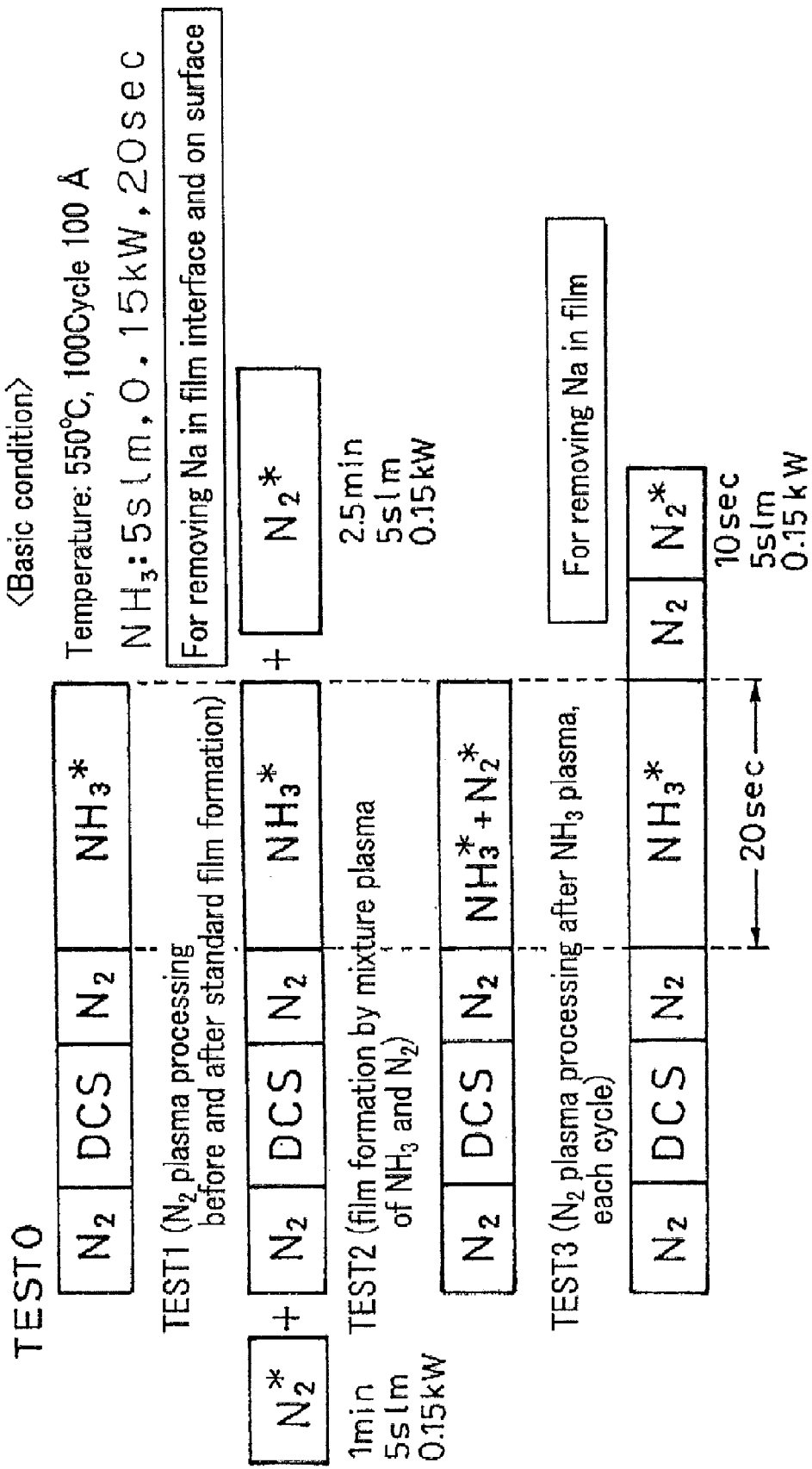
FIG. 23 is a diagram for explaining a supply method of ionized $N_2$ gas.

As a supply method of $N_2$ ionized gas, studies of a method as shown in FIG. 23 were performed.

TEST0 is a conventional condition without $N_2$ plasma processing.

An object of TEST1 is to carry out $N_2$ plasma processing before and after ALD film formation (before and after the cycle is carried out predetermined times), and to remove adsorption of Na before and after the film is formed.

TEST2 is a technique for irradiating a film with $N_2$ plasma at the same time during irradiation of $NH_3$ plasma which is necessary for ALD film formation and to remove the adsorbed Na in the formed film.

TEST3 is a technique for carrying out $N_2$ plasma processing every ALD film formatting cycle to remove the adsorbed Na in the formed film.

Figure 24:
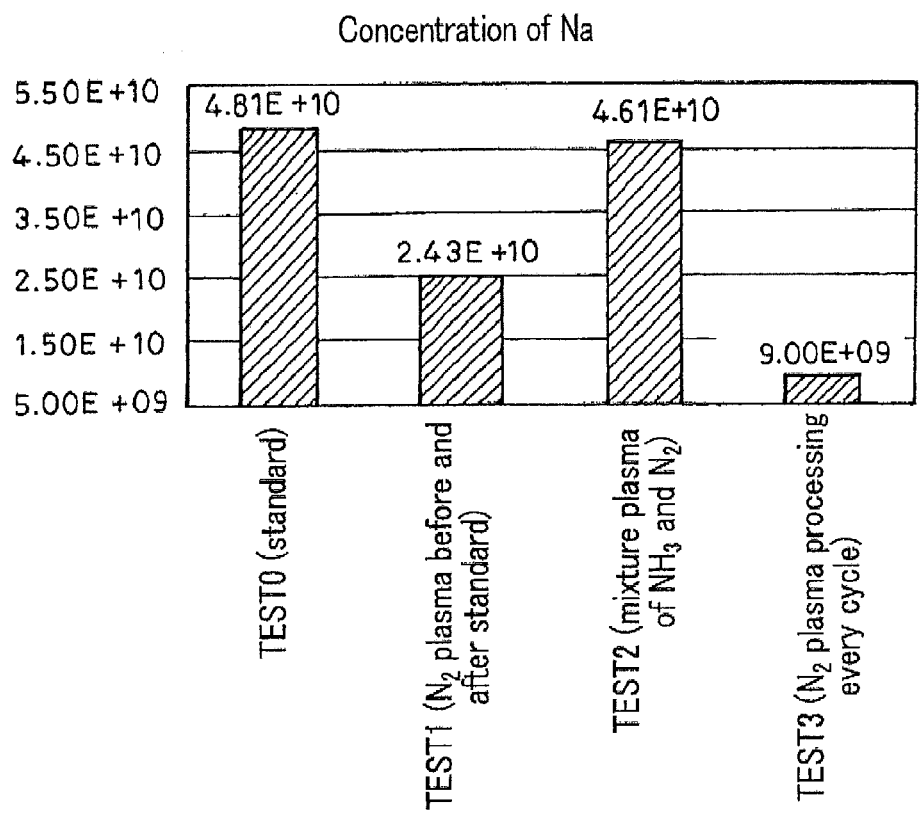
FIG. 24 is a diagram showing a relation between a supply method of ionized $N_2$ gas and concentration of Na in a film.

FIG. 24 shows the result.

If attention is paid to TEST1 and TEST3, since $N_2$ plasma processing is carried out, a reduction effect of Na can be found.

In the TEST3, the $N_2$ plasma time is 10 seconds×100 cycles=1,000 seconds (17 minutes) and is longer than that of the TEST1 and thus, it is conceived that the Na concentration reduction effect is higher. In the TEST1, it is conceived that only Na of mainly the film surface is removed and the amount of Na removed from inside of the film is very small. In the TEST3, since the film is irradiated with $N_2$ plasma every one cycle, it is conceived that the Na removing efficiency is more excellent than TEST1.

In the TEST2, it can be determined that if films are irradiated with $NH_3$ plasma and $N_2$ plasma at the same time, there is no Na reducing effect. This is because that if negative charge of $NH_4^-$ exists, the adsorption of Na proceeds, and in order to remove the adsorbed Na, it is necessary to once stop the irradiation of $NH_3$ plasma.

Sixth Embodiment

In the present embodiment, the same apparatus as that of the first embodiment was used, with TMA in the first embodiment replaced by DCS (dichloro-silane: $SiH_2Cl_2$), $O_3$ replaced by $NH_3$ radical and $O_2$ replaced by mixture gas of $N_2$ and $NH_3$, respectively. Then, DCS and $NH_3$ radical were alternately supplied to form a $Si_3N_4$ film by the ALD method and then, the $Si_3N_4$ film was reformed by plasma of gas mixture of $N_2$ and $NH_3$.

More specifically, a film forming step in which a DCS gas irradiation step and a $NH_3$ plasma irradiation step are repeated, thereby depositing an SiN thin film of several nm on an Si substrate at a depositing speed of 3 nm/min or higher, and a foreign matter removing step in which in order to remove foreign matters generated in the first step, plasma gas is generated using mixture gas of $N_2$ and $NH_3$ and the Si substrate is irradiated with the plasma gas are repeatedly carried out, thereby reducing contamination caused by foreign matters.

A mixture ratio of mixture gas of $N_2$ and $NH_3$ is in a range of 1:1 to 6:1, plasma is generated under a pressure of 0.5 Torr, an Si substrate is exposed to the plasma gas, thereby removing foreign matters adhered to the Si substrate.

As one of semiconductor producing steps, an amorphous silicon nitride film (SiN, hereinafter) is formed by the ALD method using DCS (dichloro-silane) and $NH_3$ (ammonia) plasma at a lower substrate temperature of 550° C. or lower. Here, SiN is formed on the substrate by DCS irradiation processing and $NH_3$ plasma irradiation processing. By repeating these two processing (cycle processing, hereinafter), SiN having a predetermined film thickness can be deposited on the substrate. However, the ALD method has a defect that a thin film is accumulatively deposited on a gas-contact portion other than the substrate. Therefore, the following problem is prone to be generated.

The problem is contamination of peeled-off foreign matters caused by generation of micro crack of an accumulated film. The foreign matter contamination is more prone to be generated as the substrate temperature at the time of SiN deposition becomes lower, as the deposition speed becomes higher or as the accumulated film thickness becomes thicker. This is because that as the substrate temperature becomes lower or as the depositing speed becomes higher, the amount of impurities mixed into the accumulated film increases, the impurities are annealed and detached by thermal energy caused by continuous film forming processing, micro cracks are generated by repeating shrinkage and expansion, and the peeled-off foreign matter contamination occurs. If the depositing speed is increased, it will easily be affected by the detachment of impurities. If impurities are detached during the above described cycle processing, a vapor-phase reaction occurs, and vapor phase foreign matters are prone to be increased. Therefore, this problem poses a barrier for enhancing the apparatus throughput and for improving the film quality.

The present embodiment is devised to solve this problem.

The present embodiment comprises the following two steps, and a to-be processed substrate is processed by repeating these two steps (conventionally, the SiN was deposited by repeating the first step).

First step: film forming raw material irradiation processing+reforming plasma irradiation processing (corresponding to one cycle processing in the conventional technique) Second step: foreign matter removing step by plasma By these two steps, an SiN thin film in which a degree of contamination of foreign matters is smaller than that of the conventional technique can be formed at a high speed. An explanation will be given below as to how the SiN thin film is formed and how the foreign matters are removed in each of the steps.

Figure 26:
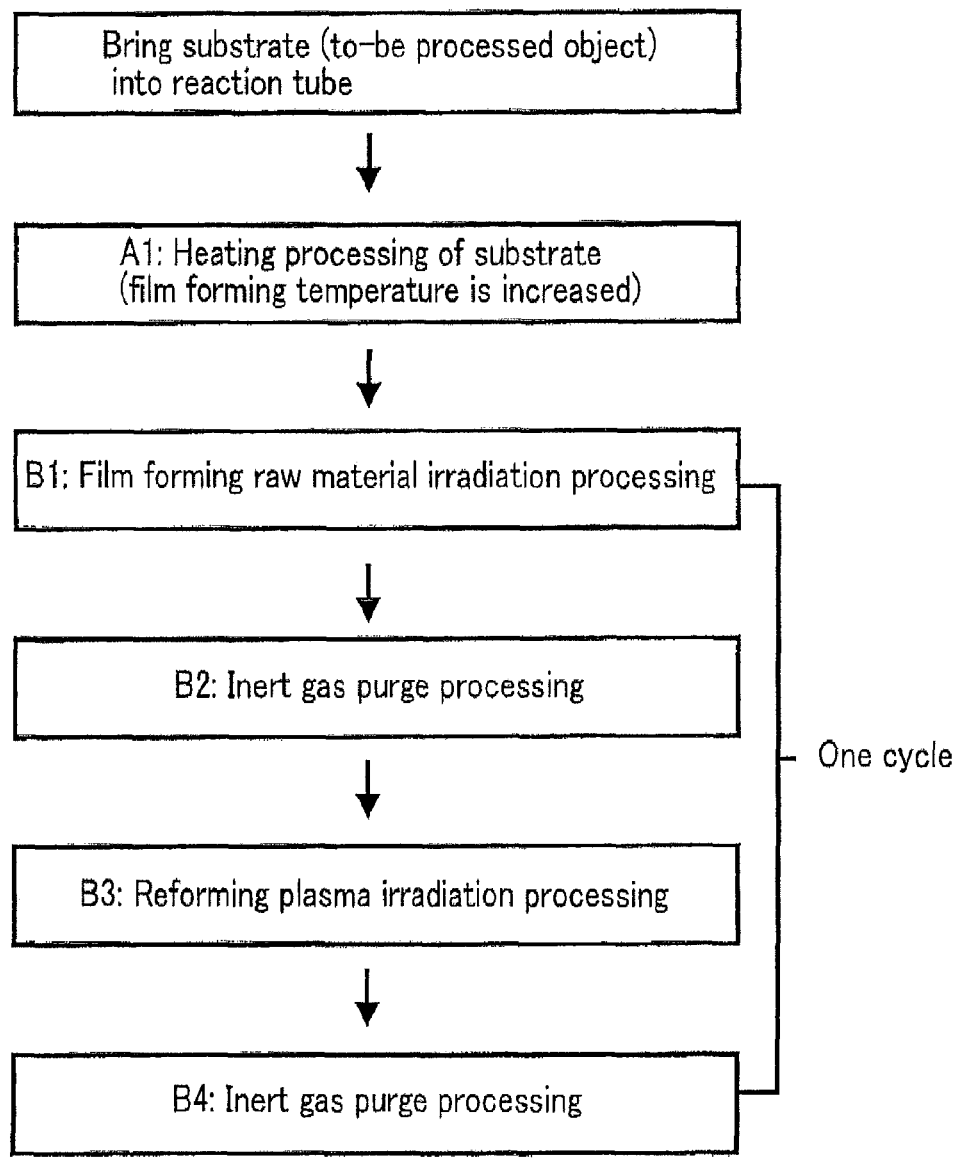
FIG. 26 is a flowchart for explaining a first step of a sixth embodiment.

First step: (film forming raw material irradiation processing+reforming plasma irradiation processing) One example of a substrate processing flow is shown in FIG. 26.

One cycle of the first step corresponds to one cycle of the conventional cycle processing step. In the apparatus shown in FIGS. 1 and 2, Si wafers 200 are set in the boat 217, the boat 217 is inserted into the reaction tube 203, and the heating processing of the substrates in step A1 is started. The processing in step A1 comprises, for example, the following processing. The step may be carried out in accordance with surface states of the Si wafers 200.

(1) Low Pressure Processing

A pressure in the reaction tube 203 is reduced by the vacuum pump 246, thereby detaching impurities adhered to surfaces of the wafers 200.

(2) Inert Gas Cycle Purge Processing

In this processing, inert gas is introduced into the reaction tube 203 having a low pressure through the gas supply tube 232g at fixed intervals, allowing impurities adhering to the surface of the substrate to be dissolved into the inert gas and to be removed. This processing is preferably carried out while heating the substrates of the wafers 200.

(3) Plasma Surface Processing (Plasma Surface Oxidation Processing, Plasma Surface Reducing Processing)

In this processing, surface processing gas is introduced into the reaction tube 203 having the low pressure through the gas supply tube 232g and in this state, electric discharge is generated between the rod-like electrode 269 and the rod-like electrode 270 by the high frequency power supply 273 to generate plasma in the buffer chamber 237. With this processing, the wafers 200 are irradiated with the plasma-processed surface processing gas through the gas supply holes 248a formed in the buffer chamber 237. This processing is for removing impurities adhering to the surfaces of the wafers 200 after the above processing (1) and (2) is carried out, and the processing is preferably carried out while rotating the wafers 200 by the boat rotating mechanism 267. The surface processing gas at the time of plasma surface oxidation processing is mainly $O_2$, and is reforming gas having a function as an oxidizer. The surface processing gas at the time of plasma surface reducing processing is mainly $H_2$, and is reforming gas having a function as a reducing agent. Supply systems of $H_2$ and $O_2$ are not illustrated.

The heating processing is started by inserting the boat 217 into the reaction tube 203. The temperature in the reaction tube 203 is maintained at a constant value by the heater 207, and the wafer 200 can be heated and maintained at a predetermined temperature. It is desirable that the temperature to be maintained is the film forming temperature suitable for the film forming raw material as will be described later.

Plasma processing in the later-described step B3 is the same as the above-described plasma surface processing, and only a gas species to be supplied to the buffer chamber 237 is different.

Next, the processing in steps B1 to B4 is carried out and thin films are formed on the wafers. In the SiN depositing operation using the ALD method, it is preferable that, for example, the film forming raw material is DCS and the film forming temperature (wafer temperature) is 450° C. or lower. This is because the SiN thin films can be formed on circuit patterns which are previously formed on the wafers without causing thermal damage and with excellent step coverage.

In the film forming raw material irradiation processing in step B1, a film forming raw material is adhered to the surfaces of the wafers or a reactive intermediate generated in the process of pyrolysis is adhered to the surfaces of the wafers. In the inert gas purge processing in step B2, the adhered film forming raw material is equalized or component (called component including the intermediate) of the film forming raw material which is not adhered to the surfaces of the wafers is exhausted. In the reforming plasma irradiation processing in step B3, the adhered film forming raw material and the plasma-excited reforming gas react with each other to deposit thin films of atomic layer level. In the inert gas purge processing in step B4, reaction by-product generated in step B3 is exhausted from the processing chamber.

Referring to FIGS. 1 and 2, an example in which the film forming raw material is DCS and the reforming plasma is $NH_3$ plasma will be explained. In the film forming raw material irradiation processing in step B1, DCS is supplied into the reaction tube 203 through the gas supply tube 232b. Then, the supply of DCS is stopped in the inert gas purge processing in step B2 and then, $N_2$ gas is supplied into the reaction tube 203 through the gas supply tube 232b. In the reforming plasma irradiation processing in step B3, $NH_3$ gas is supplied into the reaction tube 203 through the gas supply tube 232a. During the processing in step B3, electric power is supplied to the high frequency power supply 273 and plasma is generated between the rod-like electrode 269 and the rod-like electrode 270. In the inert gas purge processing in step B4, the supply of $NH_3$ and plasma are stopped and then, $N_2$ gas is supplied into the reaction tube 203 through the gas supply tube 232a. By repeating the processing of steps B1 to B4, the SiN thin films have been conventionally formed. The formed SiN thin films are amorphous thin films comprising elements including Si, N, Cl and H.

Here, in order to enhance the depositing speed of the thin films by the ALD method in the first step (corresponding to the conventional processing), it is necessary to shorten the one cycle. In the film forming raw material irradiation processing in step B1, the film forming raw material causes interaction with a gas-contact portion including the surface of the substrate to be brought into the adsorption state. The adsorption state is a state in which a raw material is trapped in a thin interaction layer formed on a surface of the gas-contact portion, and it is assumed that the film forming raw material repeats adsorption and detachment in the interaction layer to cause the film forming raw material to move. At that time, a portion of the film forming raw material may become an intermediate (e.g., called radical) due to the pyrolysis depending on the temperature of the substrates. When the portion of the film forming raw material becomes the intermediate, since a molecular structure thereof generally loses electric object and polarity becomes strong, the interaction (electrical attracting effect) becomes strong and thus, the intermediate does not easily move. When the film forming raw material is DCS for example, if the temperature of the substrate becomes 450° C. or higher, the amount of produced intermediates is increased, to increase the adsorption amount in one cycle, resulting in increase in the depositing speed. However, the moving speed is reduced and as a result, covering ability of a step is prone to be lost. In the case of DCS, it becomes difficult to produce the intermediate at a low temperature of 400° C. or lower, there is a strong tendency that the adsorption amount (residual amount) becomes constant, and the depositing speed becomes constant.

However, in the adsorption state, since the adsorption and detachment are repeated in the interaction layer, the detachment is facilitated by the inert gas purge in the subsequent step B2. Thus, if the time of step B2 is increased, the adsorption amount is reduced and the depositing speed is reduced. Therefore, in order to enhance the depositing speed, it is necessary to shorten the time of step B2. If the time of step B2 is shortened, however, the adsorption amount of the film forming raw material, i.e., the residual amount of raw material in the chamber is increased, and the amount of foreign matters generated by the vapor-phase reaction is increased in the reforming plasma irradiation processing in the subsequent step B3. Thus, the supply speed of inert gas in step B2 is increased so that the film forming raw material and the reforming plasma do not cause a vapor-phase reaction. However, in the interaction layer, the adsorption molecules of the film forming raw material are not standing still and a portion of the molecules are in their detaching state. Thus, if the time of step B2 is shortened, foreign matters by the vapor-phase reaction are increased.

As described above, if one cycle time is shortened, foreign matters are increased and thus, it is difficult to obtain the depositing speed of 3 nm/minute or more with the conventional method.

Figure 27:
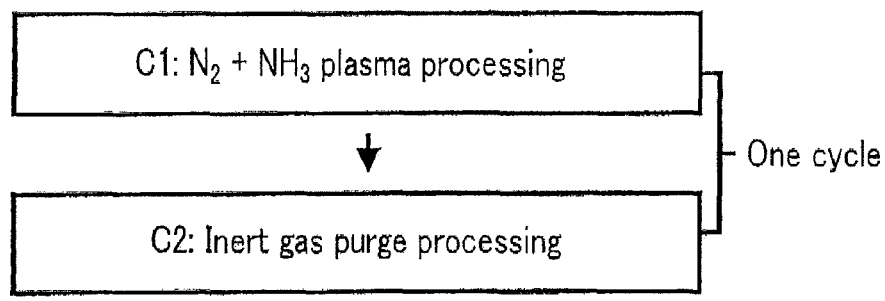
FIG. 27 is a flowchart for explaining a second step of the sixth embodiment.

In the present embodiment, in order to solve the problem of the conventional method, the second step for removing vapor-phase reaction foreign matters is carried out subsequent to the first step. It is assumed that in the first step, speed is increased and vapor-phase foreign matters are generated. An example is shown in FIG. 27.

When the film forming raw material is DCS and the reforming plasma is $NH_3$, the vapor-phase foreign matters are powder SiN but most of them are negatively or positively charged by the reforming plasma irradiation processing of step B3 in the first step. Since the wafers are negatively charged, of the vapor-phase foreign matters, only foreign matters which are positively charged or electrically neutral foreign matters can be adhered to the wafers, and other foreign matters which are negatively charged can not be adhered to the wafers. In FIG. 27, $N_2+NH_3$ plasma processing (processing using plasma-excited mixture gas of $N_2$ gas and $NH_3$ gas) is for negatively charging the positively charged foreign matters or neutral foreign matters.

Therefore, after the processing in step C1, since the foreign matters on the wafer cannot maintain the electrical adhering state, the foreign matters can be exhausted by the inert gas purge processing in the subsequent step C2.

Using the apparatus as shown in FIGS. 1 and 2, and using a substrate on which about 500 to 900 foreign matters of 0.1 μm were adhered, the reducing width of the foreign matters was measured under the condition of the second step. FIG. 28 shows a result of the measurement.

From this result, it can be found that the plasma irradiation by mixture gas of $N_2$ and $NH_3$ is effective for removing foreign matters. It can be found that even if the mixing ratio is 6:1, there is an effect.

Next, FIG. 29 shows the number of foreign matters of 0.1 to 0.13 μm when a pressure at the time of plasma irradiation is 0.5 Torr or higher.

From this result, it can be found that even in the case of the plasma irradiation of $N_2$ and $NH_3$ mixture gas, if the pressure is high, the foreign matter removing effect is lost.

As explained above, in the present embodiment, in the process in which foreign matters are prone to be generated, i.e., in the thin film deposition using high speed ALD method, it is possible to efficiently remove the foreign matters as compared with the conventional technique.

As described above, according to the preferred first to sixth embodiments of the present invention, a large number of wafers can be subjected to plasma processing collectively, and the film forming processing and the plasma processing can be carried out by the integral apparatus. Therefore, the productivity can be enhanced.

Figure 30:
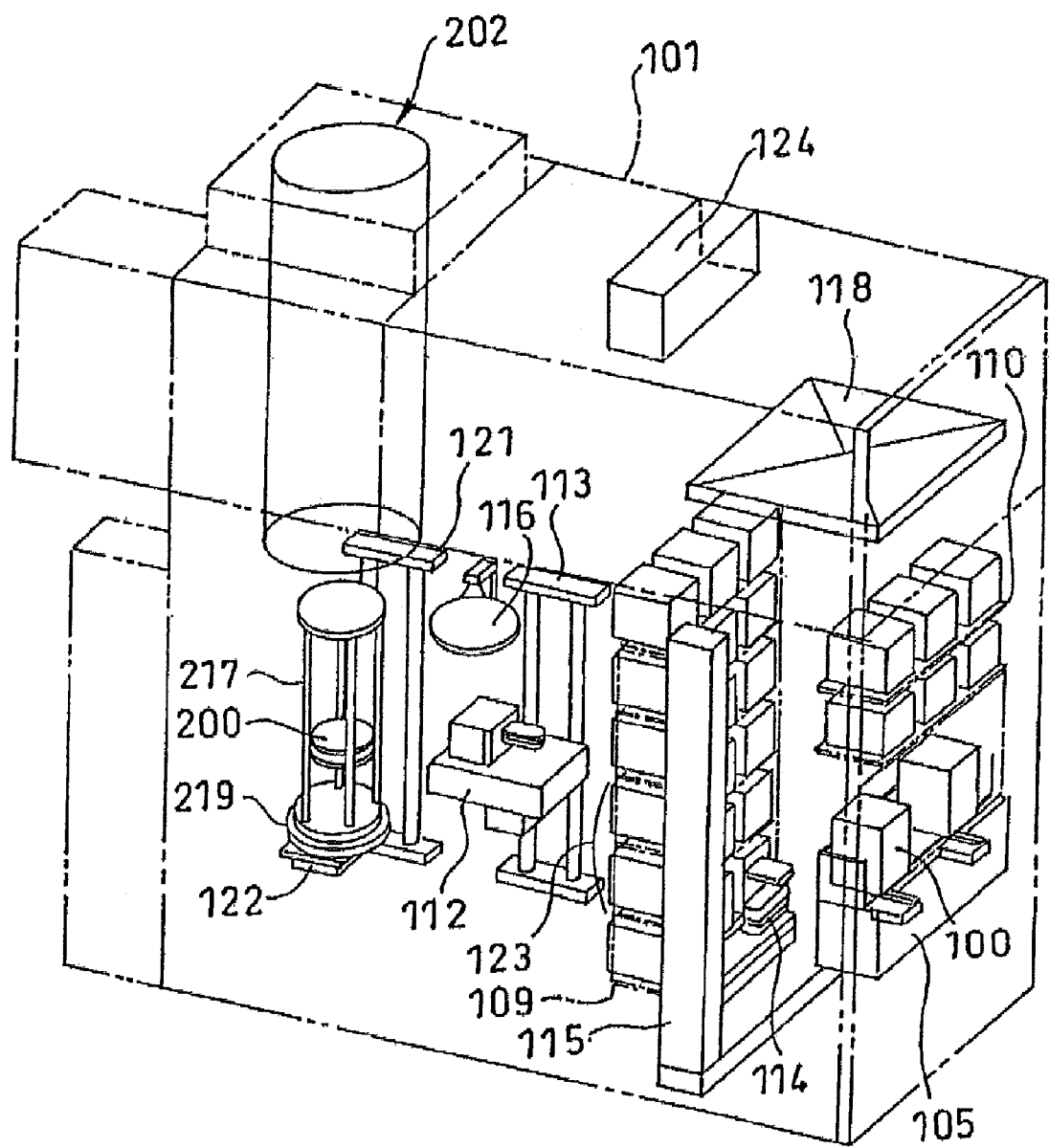
FIG. 30 is a schematic perspective view for explaining a substrate processing apparatus according to preferred embodiments of the present invention.
Figure 31:
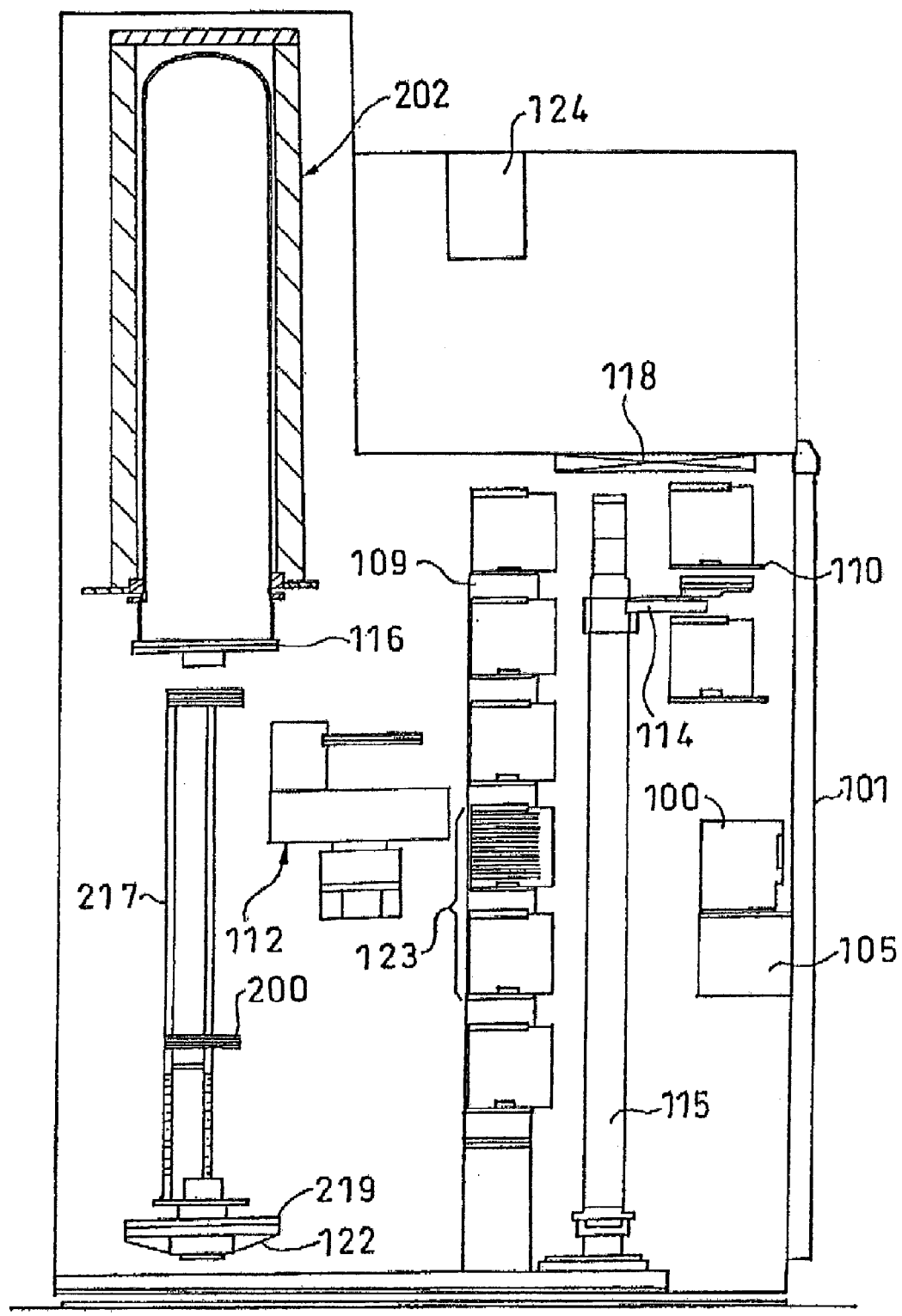
FIG. 31 is a schematic vertical sectional view for explaining a substrate processing apparatus according to the preferred embodiments of the present invention.

Next, an outline of the substrate processing apparatus of the preferred embodiment will be explained with reference to FIGS. 30 and 31.

A cassette stage 105 as a holder delivery member which delivers cassettes 100 as substrate accommodating containers to and from an external transfer device (not shown) is provided on a front side in a case 101. A cassette elevator 115 as elevator means is provided behind the cassette stage 105. A cassette transfer device 114 as transfer means is mounted on the cassette elevator 115. Cassette shelves 109 as mounting means of the cassettes 100 are provided behind the cassette elevator 115. Auxiliary cassette shelves 110 are also provided above the cassette stage 105. A clean unit 118 is provided above the auxiliary cassette shelves 110 and clean air flows through the case 101.

The processing furnace 202 is provided on the rear side and at an upper portion in the case 101. The boat elevator 121 as elevator means is provided below the processing furnace 202. The boat elevator 121 vertically brings the boat 217 as the substrate holding means into and from the processing furnace 202. The boat 217 holds the wafers 200 as substrates in many layers in their horizontal attitudes. The seal cap 219 as a lid is mounted on a tip end of the elevator member 122 which is mounted on the boat elevator 121, and the seal cap 219 vertically supports the boat 217. A transfer elevator 113 as elevator means is provided between the boat elevator 121 and the cassette shelf 109, and a wafer transfer device 112 as transfer means is mounted on the transfer elevator 113. A furnace opening shutter 116 as closing means which air-tightly closes a lower side of the processing furnace 202 is provided beside the boat elevator 121. The furnace opening shutter 116 has an opening/closing mechanism.

The cassette 100 in which wafers 200 are loaded is transferred onto the cassette stage 105 from an external transfer device (not shown) in such an attitude that the wafers 200 are oriented upward, and the cassette 100 is rotated by the cassette stage 105 by 90° such that the wafers 200 are oriented horizontally. The cassette 100 is transferred from the cassette stage 105 onto the cassette shelf 109 or the auxiliary cassette shelf 110 by a combination of vertical and lateral motions of the cassette elevator 115, and advancing and retreating motions and a rotation motion of the cassette transfer device 114.

Some of the cassette shelves 109 are transfer shelves 123 in which cassettes 100 to be transferred by the wafer transfer device 112 are accommodated. Cassettes 100 to which the wafers 200 are transferred are transferred to the transfer shelf 123 by the cassette elevator 115 and the cassette transfer device 114.

If the cassette 100 is transferred to the transfer shelf 123, the transfer shelf 123 transfers the wafers 200 to the lowered boat 217 by a combination of advancing and retreating motions and a rotation motion of the wafer transfer device 112, and a vertical motion of the transfer elevator 113.

If a predetermined number of wafers 200 are transferred to the boat 217, the boat 217 is inserted into the processing furnace 202 by the boat elevator 121, and the seal cap 219 air-tightly closes the processing furnace 202. The wafers 200 are heated in the air-tightly closed processing furnace 202, processing gas is supplied into the processing furnace 202, and the wafers 200 are processed.

If the processing of the wafers 200 is completed, the wafers 200 are transferred to the cassette 100 of the transfer shelf 123 from the boat 217, the cassette 100 is transferred to the cassette stage 105 from the transfer shelf 123 by the cassette transfer device 114, and is transferred out from the case 101 by the external transfer device (not shown) through the reversed procedure. When the boat 217 is in its lowered state, the furnace opening shutter 116 air-tightly closes the lower surface of the processing furnace 202 to prevent outside air from being drawn into the processing furnace 202.

The transfer motions of the cassette transfer device 114 and the like are controlled by transfer control means 124.

The entire disclosure of Japanese Patent Application No. 2005-40501 filed on Feb. 17, 2005 including specification, claims, drawings and abstract are incorporated herein by reference in its entirety.

INDUSTRIAL APPLICABILITY

As explained above, according to the preferred embodiments of the present invention, there is provided a semiconductor device producing method and a substrate processing apparatus capable of forming a high quality thin film when a thin film is formed using the ALD method.

As a result, the invention can suitably be utilized for a producing method of a semiconductor device using a semiconductor silicon substrate, and a semiconductor silicon substrate processing apparatus.

The invention claimed is:

1. A producing method of a semiconductor device comprising:
    a first step of supplying a first reactant to a substrate accommodated in a processing chamber to cause a ligand-exchange reaction between a ligand of the first reactant and a ligand as a reactive site existing on a surface of the substrate;
    a second step of removing a surplus of the first reactant from the processing chamber,
    a third step of supplying a second reactant to the substrate to cause a ligand-exchange reaction to change the ligand after the exchange in the first step into a reactive site;
    a fourth step of removing a surplus of the second reactant from the processing chamber;
    a fifth step of supplying a plasma-excited third reactant to the substrate to cause a ligand-exchange reaction to exchange a ligand which has not been exchange-reacted into the reactive site in the third step into the reactive site; and
    repeating the first to fifth steps until a film having a predetermined thickness is formed on the surface of the substrate.

2. The producing method of the semiconductor device as claimed in claim 1, wherein the ligand-exchange reaction in each of the third and fifth steps is a step of carrying out a ligand removing reaction in which the ligand existing at the surface of the substrate is removed to form the reactive site.

3. The producing method of the semiconductor device as claimed in claim 1, wherein a ligand-exchange reaction is carried out between the reactive site generated as a result of the exchange reaction in the fifth step and the ligand of the first reactant supplied in a subsequent first step.

* * * * *